United States Patent
Freimann et al.

(10) Patent No.: US 9,575,224 B2
(45) Date of Patent: Feb. 21, 2017

(54) MIRROR, PROJECTION OBJECTIVE WITH SUCH MIRROR, AND PROJECTION EXPOSURE APPARATUS FOR MICROLITHOGRAPHY WITH SUCH PROJECTION OBJECTIVE

(71) Applicant: Carl Zeiss SMT GmbH, Oberkochen (DE)

(72) Inventors: Rolf Freimann, Aalen (DE); Norman Baer, Aalen (DE); Guido Limbach, Aalen (DE); Thure Boehm, Aalen (DE); Gero Wittich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 475 days.

(21) Appl. No.: 13/846,785

(22) Filed: Mar. 18, 2013

(65) Prior Publication Data
US 2013/0286471 A1 Oct. 31, 2013

Related U.S. Application Data

(63) Continuation of application No. PCT/EP2011/065873, filed on Sep. 13, 2011.
(Continued)

(30) Foreign Application Priority Data

Sep. 27, 2010 (DE) .................. 10 2010 041 397
Sep. 28, 2010 (DE) .................. 10 2010 041 502

(51) Int. Cl.
*F21V 9/04* (2006.01)
*F21V 9/06* (2006.01)
(Continued)

(52) U.S. Cl.
CPC ............. *G02B 5/0891* (2013.01); *B82Y 10/00* (2013.01); *G21K 1/062* (2013.01); *G21K 2201/061* (2013.01)

(58) Field of Classification Search
CPC ......... B82Y 10/00; G02B 5/0891; G02B 5/08; G02B 5/0816–5/0875; G21K 1/062; G21K 2201/061; G03F 7/70058; G03F 7/702
(Continued)

(56) References Cited

U.S. PATENT DOCUMENTS 5,310,603 A 5/1994 Fukuda et al.
5,433,988 A * 7/1995 Fukuda .................. B32B 15/08
359/359
(Continued)

FOREIGN PATENT DOCUMENTS

CN 101088031 A 12/2007
DE 10127086 A1 12/2002
(Continued)

OTHER PUBLICATIONS

German Office Action mailed on Jun. 8, 2011 directed to German Patent Application DE 10 2010 041 502.2
(Continued)

*Primary Examiner* — Ricky Mack
*Assistant Examiner* — Mustak Choudhury
(74) *Attorney, Agent, or Firm* — Edell, Shapiro & Finnan, LLC

(57) ABSTRACT

A mirror (1*a*; 1*a*'; 1*b*; 1*b*; 1*c*; 1*c*') with a substrate (S) and a layer arrangement configured such that light (32) having a wavelength below 250 nm and incident on the mirror at at least an angle of incidence of between 0° and 30° is reflected with more than 20% of its intensity. The layer arrangement has at least one surface layer system (P''') having a periodic sequence of at least two periods (P3) of individual layers,
(Continued)

wherein the periods (P3) include a high refractive index layer (H'") and a low refractive index layer (L'"). The layer arrangement has at least one graphene layer. Use of graphene (G, SPL, B) on optical elements reduces surface roughness to below 0.1 nm rms HSFR and/or protects the EUV element against a radiation-induced volume change of more than 1%. Graphene is also employed as a barrier layer to prevent layer interdiffusion.

22 Claims, 18 Drawing Sheets

Related U.S. Application Data

(60) Provisional application No. 61/387,214, filed on Sep. 28, 2010, provisional application No. 61/386,634, filed on Sep. 27, 2010.

(51) Int. Cl.
| | |
|---|---|
| *G02B 5/08* | (2006.01) |
| *G02B 5/20* | (2006.01) |
| *B82Y 10/00* | (2011.01) |
| *G21K 1/06* | (2006.01) |

(58) Field of Classification Search
USPC ....... 359/359, 360, 584, 883, 585, 350, 577, 359/580; 428/141, 408, 433, 446, 472, 428/698, 704, 913
See application file for complete search history.

(56) References Cited

U.S. PATENT DOCUMENTS

| | | | |
|---|---|---|---|
| 6,048,652 A * | 4/2000 | Nguyen et al. | 430/5 |
| 7,903,338 B1 * | 3/2011 | Wach | A61B 5/0084 359/588 |
| 2002/0044287 A1 | 4/2002 | Otaki | |
| 2003/0147058 A1 * | 8/2003 | Murakami | B82Y 10/00 355/53 |
| 2004/0082247 A1 | 4/2004 | Desai et al. | |
| 2004/0174624 A1 * | 9/2004 | Weiser | B82Y 10/00 359/883 |
| 2005/0140958 A1 | 6/2005 | Fiolka et al. | |
| 2006/0132747 A1 | 6/2006 | Singer et al. | |
| 2006/0192147 A1 | 8/2006 | Kandaka et al. | |
| 2006/0192961 A1 | 8/2006 | Smith et al. | |
| 2007/0287076 A1 | 12/2007 | Masaki et al. | |
| 2008/0088916 A1 | 4/2008 | Benoit et al. | |
| 2012/0134015 A1 | 5/2012 | Paul et al. | |

FOREIGN PATENT DOCUMENTS

| | | | |
|---|---|---|---|
| DE | 102004060184 A1 | | 7/2006 |
| DE | 102009017095 A1 | | 10/2010 |
| JP | 2001227909 A | | 8/2001 |
| JP | 26388502 A | | 4/2002 |
| JP | 2006171577 A | | 6/2006 |
| JP | 2007329368 A | | 12/2007 |
| JP | 4466566 B2 | | 5/2010 |
| KR | 20100094908 A | | 8/2010 |
| WO | 2005015314 A2 | | 2/2005 |
| WO | 2005026822 A2 | | 3/2005 |
| WO | 2006111319 A2 | | 10/2006 |
| WO | 2009/129194 A2 | | 10/2009 |
| WO | 2009/158117 A2 | | 12/2009 |
| WO | 2010004482 A1 | | 1/2010 |
| WO | WO 2010004482 A1 * | 1/2010 | ............... G21K 1/06 |

OTHER PUBLICATIONS

International Search Report and Written Opinion mailed on Oct. 27, 2011 directed to PCT Patent Application PCT/EP2011/065873.
German Office Action mailed on Jun. 29, 2011 directed to German Patent Application DE 10 2010 041 397.6.
Lee, Y., et al., "Wafer-scale synthesis and transfer of graphene films".
Wang, Y., "Raman Studies of Monolayer Graphene: The Substrate Effect", American Chemical Society, 2008.
Wang, C., et al., "Formation of graphene-like carbon layers on TiO2 . . . ," APS Mar. 2010 Meeting, vol. 55, No. 2.
Chinese Office Action mailed on Feb. 13, 2015 directed to Chinese Patent Application CN 201180056893.6.
Office Action in corresponding Japanese Application No. 2013529611, dated Jul. 9, 2015, along with an English translation.
Office Action in corresponding Chinese Application No. 201180056893.6, dated Nov. 3, 2015, along with an English translation.
Nomura H. et al., Design, fabrication, and polarization of soft x-ray transmission multilayers. Proc. SPIE 1720, Intl Symp on Optical Fabrication, Testing, and Surface Evaluation, 395, Oct. 20, 1992 (Abstract only).

* cited by examiner

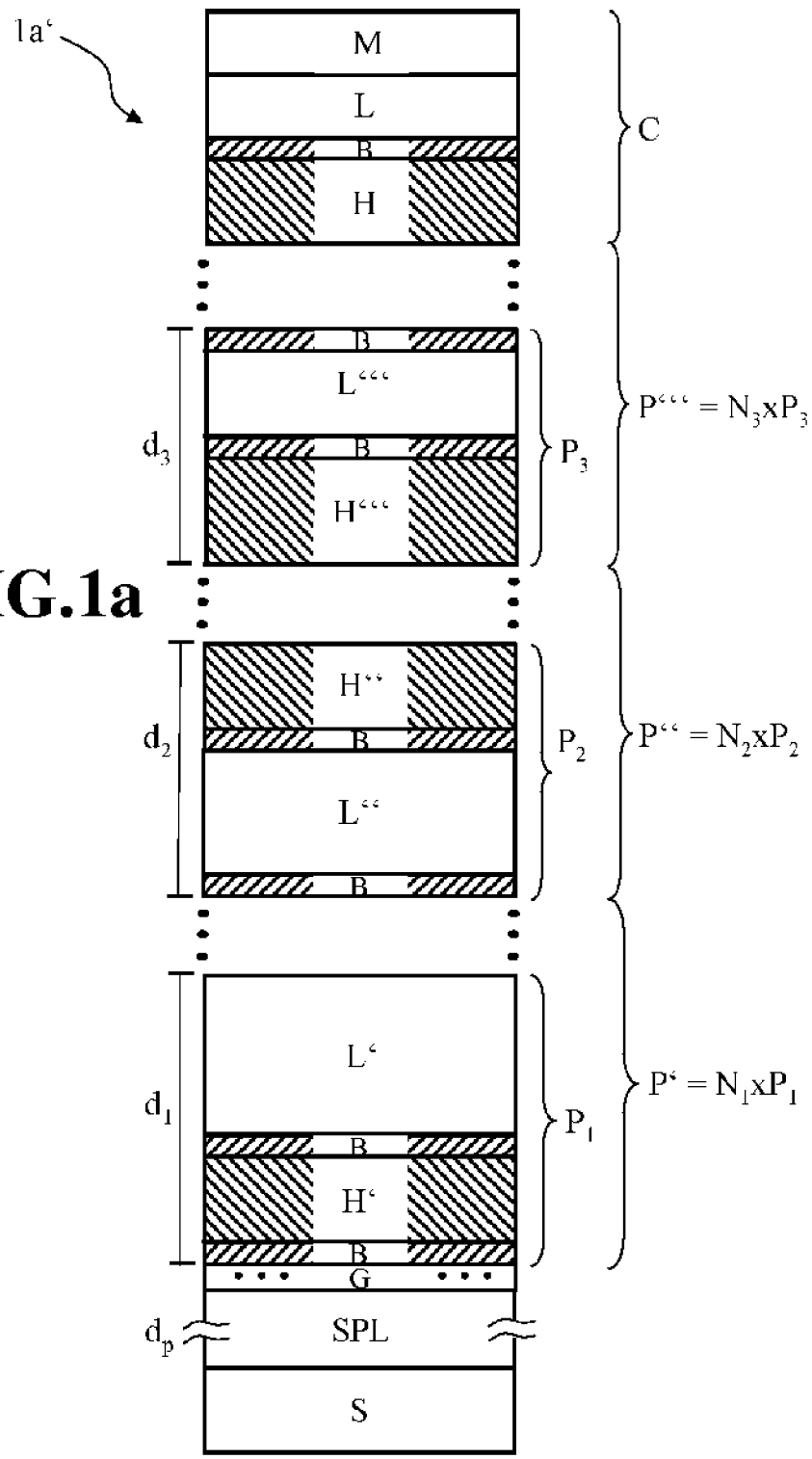

MIRROR, PROJECTION OBJECTIVE WITH SUCH MIRROR, AND PROJECTION EXPOSURE APPARATUS FOR MICROLITHOGRAPHY WITH SUCH PROJECTION OBJECTIVE

The present application is a Continuation of International Application No. PCT/EP2011/065873, filed on Sep. 13, 2011, which claims priority of German Patent Application No. 10 2010 041 397.6, filed on Sep. 27, 2010, U.S. Provisional Application No. 61/386,634, filed on Sep. 27, 2010, German Patent Application No. 10 2010 041 502.2, filed on Sep. 28, 2010, and U.S. Provisional Application No. 61/387,214, filed on Sep. 28, 2010. The disclosures of these five applications are hereby incorporated by reference in their respective entireties.

FIELD OF AND BACKGROUND OF THE INVENTION

The invention relates to a mirror. Furthermore, the invention relates to a projection objective comprising such a mirror. Moreover, the invention relates to a projection exposure apparatus for microlithography comprising such a projection objective.

Projection exposure apparatuses for microlithography for the EUV wavelength range have to rely on the assumption that the mirrors used for the imaging of a mask into an image plane have a high reflectivity since, firstly, the product of the reflectivity values of the individual mirrors determines the total transmission of the projection exposure apparatus and since, secondly, the light power of EUV light sources is limited.

Mirrors for the EUV wavelength range around 13 nm having high reflectivity values are known from DE 101 55 711 A1, for example. The mirrors described therein consist of a layer arrangement which is applied on a substrate and which has a sequence of individual layers, wherein the layer arrangement comprises a plurality of surface layer systems each having a periodic sequence of at least two individual layers of different materials that form a period, wherein the number of periods and the thickness of the periods of the individual layer systems decrease from the substrate toward the surface. Such mirrors have a reflectivity of greater than 30% in the case of an angle of incidence interval of between 0° and 20°.

In this case, the angle of incidence is defined as the angle between the direction of incidence of a light ray and the normal to the surface of the mirror at the point where the light ray impinges on the mirror. In this case, the angle of incidence interval results from the angle interval between the largest and the smallest angle of incidence respectively considered for a mirror.

What is disadvantageous about the abovementioned layers, however, is that their reflectivity in the angle of incidence interval specified is not constant, but rather varies. A variation of the reflectivity of a mirror over the angles of incidence is disadvantageous, however, for the use of such a mirror at locations with high angles of incidence and with high angle of incidence changes in a projection objective for microlithography since such a variation leads for example to an excessively large variation of the pupil apodization of such a projection objective. In this case, the pupil apodization is a measure of the intensity fluctuation over the exit pupil of a projection objective.

What is furthermore disadvantageous about the abovementioned layers is that the latter transmit too much EUV radiation to the substrate, as a result of which the substrate is exposed to high doses of EUV radiation over a long period of time. However, under high doses of EUV radiation, substrates for EUV mirrors composed of materials such as for example Zerodur® from Schott AG or ULE® from Corning Inc. tend toward densification of the order of magnitude of a few percent by volume. In the case of generally non-uniform irradiation of the mirrors, said densification leads to a non-uniform change in their surface form, as a result of which the optical imaging properties of the mirrors are changed in an undesirable manner during the operating period.

In order to obtain a high reflectivity of mirrors for the EUV wavelength range it is also necessary to avoid losses on account of stray light, which leads to stringent requirements made of the surface roughness of such mirrors in the so-called HSFR range, see U. Dinger et al. "Mirror substrates for EUV-lithography: progress in metrology and optical fabrication technology" in Proc. SPIE Vol. 4146, 2000, in particular for the definition of the surface roughness in the HSFR range with spatial wavelengths of the roughness of 10 nm to 1 µm (HSFR=high spatial frequency roughness) and in the MSFR range with spatial wavelengths of the roughness of 1 µm to 1 mm (MSFR=mid spatial frequency roughness). Furthermore, such mirrors have to ensure the high reflectivity values and the desired optical imaging quality even over a period of several years under continuous irradiation with high-intensity EUV radiation.

Other mirrors, too, which are used within projection exposure apparatuses for microlithography at wavelengths of less than 250 nm have to have low values for the surface roughness in the HSFR range in order to avoid stray light losses.

OBJECTS AND SUMMARY OF THE INVENTION

Therefore, it is an object of the invention to provide a mirror which minimizes the losses as a result of stray light. Furthermore, the object of the invention is to provide a mirror for the EUV wavelength range which, even at high doses of EUV radiation, has a high long-time stability of its optical properties during the operating period of from a few months to a few years and simultaneously minimizes the losses as a result of stray light.

According to one formulation of the invention, this object is achieved by a mirror comprising a substrate and a layer arrangement, wherein the layer arrangement is designed in such a way that light having a wavelength of less than 250 nm that is incident on the mirror at at least an angle of incidence of between 0° and 30° is reflected with more than 20% of its intensity, and the layer arrangement comprises at least one surface layer system consisting of a periodic sequence of at least two periods of individual layers, wherein the periods comprise two individual layers composed of different materials for a high refractive index layer and a low refractive index layer and wherein the layer arrangement comprises at least one layer composed of graphene.

In the context of this application, a layer comprised of graphene is understood to mean a layer which consists at least of a monolayer of carbon atoms, wherein the carbon atoms have an $sp^2$ hybridization.

The terms high refractive index and low refractive index are in this case relative terms with regard to the respective partner layer in a period of a surface layer system. Surface layer systems generally function only if a layer that acts with optically high refractive index is combined with an optically lower refractive index layer relative thereto as main constituent of a period of the surface layer system. This applies in particular to the EUV wavelength range.

According to the invention, it has been recognized that a low surface roughness of the at least one layer composed of graphene is sufficient to reduce the stray light losses of surfaces of optical elements. This applies in particular to mirrors since the latter, by their nature, are more susceptible to stray light losses than lenses. In particular mirrors for the EUV wavelength range, as mentioned in the introduction, have to have very low values for stray light. This applies in particular to mirrors for the EUV wavelength range which are equipped with a substrate protecting layer (SPL) or a substrate protecting layer system (SPLS), since said substrate protecting layer (SPL) or the layers of the substrate protecting layer system (SPLS) are generally constructed from metals having high surface roughnesses. In this respect, it is possible to compensate for the roughness of other layers, in particular of substrate protecting layers, utilizing the surface roughness of graphene, such that at least one reflective surface layer system can be applied on the smooth graphene layer as support, which system can thereby grow in a manner undisturbed by the roughness of the support. Otherwise, the roughness of the substrate protecting layers is transferred directly to the reflective surface layer system.

Consequently, it is possible to reduce the stray light losses of a mirror with a layer composed of graphene. Furthermore, it is possible to protect the substrate of a mirror for the EUV wavelength range against long-term degradation to a sufficient extent with the help of a substrate protecting layer or a substrate protecting layer system and simultaneously to avoid stray light losses as a result of said substrate protecting layer or the substrate protecting layer system.

In one embodiment, the at least one layer composed of graphene has a surface roughness of less than 0.1 nm rms HSFR, in particular less than 0.04 nm rms HSFR. Stray light losses are avoided as a result of such low roughness values in the HSFR range.

Furthermore, the object of the present invention is achieved with a mirror comprising a substrate and a layer arrangement, wherein the layer arrangement is designed in such a way that light having a wavelength of less than 250 nm that is incident on the mirror at at least an angle of incidence of between 0° and 30° is reflected with more than 20% of its intensity, and the layer arrangement comprises at least one surface layer system consisting of a periodic sequence of at least two periods of individual layers, wherein the periods comprise two individual layers composed of different materials for a high refractive index layer and a low refractive index layer. Furthermore, the layer arrangement comprises at least one layer having a surface roughness of less than 0.1 nm rms HSFR, in particular less than 0.04 nm rms HSFR.

According to the invention, it has been recognized that a low surface roughness in the HSFR range of at least one layer of the layer arrangement is sufficient to avoid stray light losses of a mirror. In particular, the surface roughness of a substrate protecting layer (SPL) or of a substrate protecting layer system (SPLS) can be compensated for by a low surface roughness in the HSFR range of at least one layer of the layer arrangement. As a result, it is possible to protect the substrate against long-term degradation to a sufficient extent with a substrate protecting layer or a substrate protecting layer system and simultaneously to avoid stray light losses as a result of said substrate protecting layer or the substrate protecting layer system.

In one embodiment, the at least one layer has a surface roughness of less than 0.1 nm rms, in particular less than 0.07 nm for spatial frequencies above the HSFR range. Such layers, which are designated as "atomically smooth", reduce the roughness of other layers applied to the "atomically smooth" layer by virtue of the fact that from the outset no defects are present which could be intensified by the growth of the other layers and could thus contribute to the surface roughness of said layers.

In another embodiment, the mirror is a mirror for the EUV wavelength range which reflects EUV radiation incident on the mirror at at least an angle of incidence of between 0° and 30° with more than 20% of its intensity. Particularly in the case of mirrors for the EUV wavelength range which are used at locations of high angle of incidence intervals, it is necessary to minimize the stray light losses since said mirrors generally do not have overly high reflectivity values in the entire angle of incidence interval in comparison with so-called "normal incidence" mirrors, which cover only small angle of incidence intervals. Consequently, stray light losses in the case of these mirrors lead to greater relative light losses than in the case of pure "normal incidence" mirrors. These relative light losses lead directly to an undesirable high pupil apodization, as mentioned in the introduction.

In a further embodiment, the layer arrangement is chosen in such a way that the transmission of EUV radiation through the layer arrangement amounts to less than 10%, in particular less than 2%. In this case, it has been recognized according to the invention that, in order to protect the substrate from excessively high doses of EUV radiation, it suffices to design the layer arrangement on the substrate of the mirror such that only a small fraction of the EUV radiation reaches the substrate. For this purpose, either the layer arrangement or the surface layer systems of the layer arrangement can be provided with a corresponding number of periods of layers or a surface protecting layer (SPL) or a surface protecting layer system (SPLS) is used, such that at all events the transmission of EUV radiation through the layer arrangement to the substrate amounts to less than 10%, in particular less than 2%.

In another embodiment, the layer arrangement comprises at least one surface protecting layer SPL or at least one surface protecting layer system SPLS having a thickness of greater than 20 nm, in particular 50 nm, wherein the surface protecting layer SPL or the surface protecting layer system SPLS experience an irreversible change in volume of less than 1%, in particular less than 0.2%, under EUV radiation.

In this case, an irreversible change in volume under EUV radiation is understood to mean not the reversible change in volume on account of thermal expansion, but rather the long-term irreversible change in volume on account of structural changes in the material under consideration caused by high doses of EUV radiation.

In this case, it has been recognized according to the invention that, besides protection of the substrate, for which a 20 nm thick surface protecting layer SPL or a 20 nm thick surface protecting layer system SPLS may already suffice depending on choice of material, it must also be taken into consideration that the surface protecting layer SPL or the surface protecting layer system SPLS must remain stable even under EUV radiation at high doses that are accumulated over the lifetime of a lithography apparatus. Otherwise, the problem of the irreversible change in volume is merely shifted from the substrate to the surface protecting layer or the surface protecting layer system, respectively.

In a further embodiment, the layer arrangement comprises at least one surface protecting layer or at least one surface protecting layer system having a thickness of greater than 20 nm, in particular of greater than 50 nm, wherein the surface protecting layer or the surface protecting layer system is provided for preventing an irreversible alteration of the surface of the substrate under EUV radiation of more than 0.1 nm measured in the normal direction. In this case, this irreversible alteration along the normal direction is compared at a location within the irradiated region of the substrate with a location outside the irradiated region. At the same time the surface protecting layer or the surface protecting layer system is provided for exerting a tensile stress for compensation of layer stresses in the layer arrangement.

In this case it has been recognized according to the invention that, besides protection of the substrate, for which a 20 nm thick surface protecting layer SPL or a 20 nm thick surface protecting layer system SPLS may already suffice depending on choice of material, it must also be taken into consideration that the surface protecting layer SPL or the surface protecting layer system SPLS is at the same time adapted for compensation of the layer stresses in the layer arrangement since otherwise the substrate bends impermissibly on account of the layer stresses. Consequently, particularly in the design of a surface protecting layer system, the resultant layer stress has to be concomitantly taken into account in the optimization. Furthermore, through the choice of material in the case of the surface protecting layer SPL and in the case of the surface protecting layer system SPLS, care must be taken to ensure that these are not altered in the case of EUV radiation at high doses since this inevitably entails an alteration of the layer stress and thus of the surface form.

In one embodiment, the layer arrangement of the mirror comprises at least one layer which is formed from or as a compound is composed of a material from the group: nickel, carbon, graphene, boron carbide, cobalt, beryllium, silicon, silicon oxides. These materials are suitable individually or in combination with one another for a surface protecting layer SPL or a surface protecting layer system SPLS. In particular relatively thick layers composed of graphene are able, given appropriate design of the other surface layer systems of the layer arrangement, to absorb the remaining EUV radiation that passes through the surface layer system, such that rough surface protecting layers SPL or surface protecting layer systems SPLS can be dispensed with in this case.

In a further embodiment, the layer arrangement of a mirror according to the invention comprises at least three surface layer systems, wherein the number of periods of the surface layer system that is situated closest to the substrate is greater than for the surface layer system that is most distant from the substrate and/or is greater than for the surface layer system that is second most distant from the substrate.

This use of a large number of periods fosters a decoupling of the reflection properties of the mirror from layers lying below the layer arrangement or from those of the substrate, such that it is possible to use other layers with other functional properties or other substrate materials below the layer arrangement of the mirror.

Firstly, it is thus possible to avoid perturbing effects of the layers lying below the layer arrangement or of the substrate on the optical properties of the mirror, and in this case in particular on the reflectivity, and, secondly, it is thereby possible for layers lying below the layer arrangement or the substrate to be protected from the EUV radiation in addition to the measures already mentioned above.

In this case, it should be taken into consideration that the properties of reflectivity, transmission and absorption of a layer arrangement behave nonlinearly with respect to the number of periods of the layer arrangement; the reflectivity, in particular, exhibits a saturation behavior toward a limit value with regard to the number of periods of a layer arrangement. The abovementioned surface protecting layer SPL or the abovementioned surface protecting layer system SPLS can also thus be used to the effect that the required number of periods of a layer arrangement is limited to the required number of periods for achieving the reflectivity properties. Otherwise, a very large number of periods would have to be used in order, besides the reflectivity, also simultaneously to provide corresponding protection by the surface layer systems.

In another embodiment, the layer arrangement comprises a quartz layer having a thickness of greater than 2 µm, in particular of greater than 5 µm, which was deposited by a CVD method, in particular a PICVD, PACVD or PECVD method. Such layers exhibit long-term stability under EUV radiation and at the same time protect the underlying substrate by virtue of their absorption.

In one embodiment, the layer arrangement comprises a quartz layer, wherein the quartz layer has a surface roughness of less than 0.5 nm rms HSFR, in particular less than 0.2 nm rms HSFR. Such quartz layers firstly lead, as mentioned in the introduction, to low stray light losses of the mirror and, secondly, can be used to provide the substrate material, which is generally difficult to polish, with a surface layer that can be polished well. As an alternative thereto, a graphene layer is suitable for compensating for the roughness of the substrate material.

In a further embodiment, the layer arrangement comprises at least one surface protecting layer system SPLS consisting of a periodic sequence of at least two periods of individual layers, where the periods comprise two individual layers composed of different materials for a high refractive index layer and a low refractive index layer, wherein the materials of the two individual layers forming the periods are either nickel and silicon or cobalt and beryllium. What is advantageous about such surface protecting layer systems SPLS by comparison with an individual surface protecting layer SPL is that although the total thickness of the absorbent layers of the surface protecting layer system SPLS corresponds to the thickness of the individual surface protecting layer SPL for the absorption effect, said absorbent layers, by comparison with said surface protecting layer, are interrupted by other layers composed of other material, as a result of which the crystal growth in the layers of the surface protecting layer system SPLS is interrupted by comparison with the crystal growth in the surface protecting layer SPL. This makes it possible to provide very smooth surfaces without high stray light losses or to produce said surfaces during the coating process using, for example, an assisting ion bombardment.

In another embodiment, the individual layers of the surface protecting layer system SPLS are separated by at least one barrier layer and the barrier layer consists of a material which is selected from or as a compound is composed of the group of materials: $B_4C$, C, graphene, Si nitride, Si carbide, Si boride, Mo nitride, Mo carbide, Mo boride, Ru nitride, Ru carbide and Ru boride. These materials mentioned prevent the interdiffusion of the individual layers of the SPLS.

In this case, in particular the roughness of graphene as a barrier layer has a compensating effect according to the invention with respect to the surface protecting layer SPL or the surface protecting layer system SPLS. As a result, even the reduced surface roughnesses of the layers interrupted in their crystal growth by intermediate layers can be decreased further. Furthermore, the graphene itself as intermediate layer can provide for the interruption of the crystal growth.

In a further embodiment, the layer arrangement comprises at least one surface protecting layer system SPLS consisting of a periodic sequence of at least two periods of individual layers, wherein the periods comprise two individual layers composed of different materials for a low refractive index layer and a barrier layer. Such surface protecting layer systems SPLS are extremely simple in their construction since the high refractive index layer or the spacer has been dispensed with.

In another embodiment, the layer arrangement comprises at least one surface protecting layer system SPLS consisting of a periodic sequence of at least two periods of individual layers, wherein the periods comprise two individual layers composed of different materials for a low refractive index layer and a barrier layer, and wherein the material for the low refractive index layer consists of nickel and the material for the barrier layer is selected from or as a compound is composed of the group of materials: $B_4C$, C, graphene, Si nitride, Si carbide, Si boride, Mo nitride, Mo carbide, Mo boride, Ru nitride, Ru carbide and Ru boride. Such surface protecting layer systems SPLS constitute a preferred material combination of a simple surface protecting layer system SPLS.

In a further embodiment, the at least one surface protecting layer system SPLS has low refractive index layers having a surface roughness of less than 0.5 nm rms HSFR, in particular of less than 0.2 nm rms HSFR. Such layers lead, as mentioned in the introduction, to low stray light losses and can be produced during the coating process for example via assisting ion bombardment.

In one embodiment, the mirror for the EUV wavelength range comprises a substrate and a layer arrangement, wherein the layer arrangement comprises a plurality of surface layer systems. In this case, the surface layer systems each consist of a periodic sequence of at least two periods of individual layers. In this case, the periods comprise two individual layers composed of different materials for a high refractive index layer and a low refractive index layer and have within each surface layer system a constant thickness that deviates from a thickness of the periods of an adjacent surface layer system. In this case, the surface layer system that is second most distant from the substrate has a sequence of the periods such that the first high refractive index layer of the surface layer system that is most distant from the substrate directly succeeds the last high refractive index layer of the surface layer system that is second most distant from the substrate and/or the surface layer system that is most distant from the substrate has a number of periods that is greater than the number of periods for the surface layer system that is second most distant from the substrate.

In this case, the surface layer systems of the layer arrangement of the mirror according to the invention succeed one another directly and are not separated by a further layer system. Furthermore, in the context of the present invention, a surface layer system is distinguished from an adjacent surface layer system, even given otherwise identical division of the periods between high and low refractive index layers, if a deviation by more than 0.1 nm is present as deviation in the thickness of the periods of the adjacent surface layer systems since, starting from a difference of 0.1 nm, it is possible to assume a different optical effect of the surface layer systems with otherwise identical division of the periods between high and low refractive index layers.

It has been recognized that in order to achieve a high and uniform reflectivity across a large angle of incidence interval, the number of periods for the surface layer system that is most distant from the substrate must be greater than that for the surface layer system that is second most distant from the substrate. Furthermore it has been recognized that, in order to achieve a high and uniform reflectivity across a large angle of incidence interval, as an alternative or in addition to the measure mentioned above, the first high refractive index layer of the surface layer system that is most distant from the substrate should directly succeed the last high refractive index layer of the surface layer system that is second most distant from the substrate.

In a further embodiment the mirror for the EUV wavelength range comprises a substrate and a layer arrangement, wherein the layer arrangement comprises a plurality of surface layer systems. In this case, the surface layer systems each consist of a periodic sequence of at least two periods of individual layers. In this case, the periods comprise two individual layers composed of different materials for a high refractive index layer and a low refractive index layer and have within each surface layer system a constant thickness that deviates from a thickness of the periods of an adjacent surface layer system. In this case, the surface layer system that is second most distant from the substrate has a sequence of the periods such that the first high refractive index layer of the surface layer system that is most distant from the substrate directly succeeds the last high refractive index layer of the surface layer system that is second most distant from the substrate. Furthermore, the transmission of EUV radiation through the surface layer systems amounts to less than 10%, in particular less than 2%.

It has been recognized that, in order to achieve a high and uniform reflectivity across a large angle of incidence interval, the influence of layers situated below the layer arrangement or of the substrate must be reduced. This is necessary primarily for a layer arrangement in which the surface layer system that is second most distant from the substrate has a sequence of the periods such that the first high refractive index layer of the surface layer system that is most distant from the substrate directly succeeds the last high refractive index layer of the surface layer system that is second most distant from the substrate. One simple possibility for reducing the influence of layers lying below the layer arrangement or of the substrate consists in designing the layer arrangement such that the latter transmits as little EUV radiation as possible to the layers lying below the layer arrangement. This affords the possibility for said layers lying below the layer arrangement or the substrate to make a significant contribution to the reflectivity properties of the mirror.

In one embodiment, the surface layer systems are in this case all constructed from the same materials for the high and low refractive index layers since this simplifies the production of mirrors.

A mirror for the EUV wavelength range in which the number of periods of the surface layer system that is most distant from the substrate corresponds to a value of between 9 and 16, and a mirror for the EUV wavelength range in which the number of periods of the surface layer system that is second most distant from the substrate corresponds to a value of between 2 and 12, lead to a limitation of the layers required in total for the reflective effect of the mirror and thus to a reduction of the complexity and the risk during the production of the mirror.

Furthermore, it has been recognized that it is possible to achieve particularly high reflectivity values for a layer arrangement in the case of a small number of surface layer systems if, in this case, the period for the surface layer system that is most distant from the substrate has a thickness of the high refractive index layer which amounts to more than 120% of the thickness, in particular more than double the thickness, of the high refractive index layer of the period for the surface layer system that is second most distant from the substrate.

It is likewise possible to achieve particularly high reflectivity values for a layer arrangement in the case of a small number of surface layer systems in a further embodiment if the period for the surface layer system that is most distant from the substrate has a thickness of the low refractive index layer which is less than 80%, in particular less than two thirds of the thickness of the low refractive index layer of the period for the surface layer system that is second most distant from the substrate.

In a further embodiment, a mirror for the EUV wavelength range has, for the surface layer system that is second most distant from the substrate, a thickness of the low refractive index layer of the period which is greater than 4 nm, in particular greater than 5 nm. As a result of this it is possible that the layer design can be adapted not only with regard to the reflectivity per se, but also with regard to the reflectivity of s-polarized light with respect to the reflectivity of p-polarized light over the angle of incidence interval striven for. Primarily for layer arrangements which consist of only two surface layer systems, the possibility is thus afforded of performing a polarization adaptation despite limited degrees of freedom as a result of the limited number of surface layer systems.

In another embodiment, a mirror for the EUV wavelength range has a thickness of the periods for the surface layer system that is most distant from the substrate of between 7.2 nm and 7.7 nm. It is thereby possible to realize particularly high uniform reflectivity values for large angle of incidence intervals.

Furthermore, a further embodiment has an additional intermediate layer or an additional intermediate layer arrangement between the layer arrangement of the mirror and the substrate, which serves for the stress compensation of the layer arrangement. With such stress compensation, it is possible to avoid deformation of the mirror during the application of the layers.

In another embodiment of a mirror according to the invention, the two individual layers forming a period consist either of the materials molybdenum (Mo) and silicon (Si) or of the materials ruthenium (Ru) and silicon (Si). It is thereby possible to achieve particularly high reflectivity values and at the same time to realize production engineering advantages since only two different materials are used for producing the surface layer systems of the layer arrangement of the mirror.

In this case, in a further embodiment, said individual layers are separated by at least one barrier layer, wherein the barrier layer consists of a material which is selected from or as a compound is composed of the group of materials: $B_4C$, C, graphene, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast in the transition of the two individual layers. With the use of the materials molybdenum and silicon for the two individual layers of a period, one barrier layer above the Si layer, as viewed from the substrate, suffices in order to provide for a sufficient contrast. The second barrier layer above the Mo layer can be dispensed with in this case. In this respect, at least one barrier layer for separating the two individual layers of a period should be provided, wherein the at least one barrier layer may perfectly well be constructed from various ones of the above-indicated materials or the compounds thereof and may in this case also exhibit a layered construction of different materials or compounds.

Barrier layers which comprise the material $B_4C$ and have a thickness of between 0.35 nm and 0.8 nm, preferably between 0.4 nm and 0.6 nm, lead in practice to high reflectivity values of the layer arrangement. Particularly in the case of surface layer systems composed of ruthenium and silicon, barrier layers composed of $B_4C$ exhibit a maximum of reflectivity in the case of values of between 0.4 nm and 0.6 nm for the thickness of the barrier layer.

In a further embodiment, a mirror according to the invention comprises a covering layer system comprising at least one layer composed of a chemically inert material, which terminates the layer arrangement of the mirror. The mirror is thereby protected against ambient influences.

In another embodiment, the mirror according to the invention has a thickness factor of the layer arrangement along the mirror surface having values of between 0.9 and 1.05, in particular having values of between 0.933 and 1.018. It is thereby possible for different locations of the mirror surface to be adapted in a more targeted fashion to different angles of incidence that occur there. In this case, the thickness factor can also comprise the surface protecting layer SPL or the surface protecting layer system SPLS, and the abovementioned additional intermediate layer or the abovementioned additional intermediate layer arrangement for stress compensation.

In this case, the thickness factor is the factor with which all the thicknesses of the layers of a given layer design, in multiplied fashion, are realized at a location on the substrate. A thickness factor of 1 thus corresponds to the nominal layer design.

The thickness factor as a further degree of freedom makes it possible for different locations of the mirror to be adapted in a more targeted fashion to different angle of incidence intervals that occur there, without the layer design of the mirror per se having to be changed, with the result that the mirror ultimately yields, for higher angle of incidence intervals across different locations on the mirror, higher reflectivity values than are permitted by the associated layer design per se given a fixed thickness factor of 1. By adapting the thickness factor, it is thus also possible, over and above ensuring high angles of incidence, to achieve a further reduction of the variation of the reflectivity of the mirror according to the invention over the angles of incidence.

In a further embodiment, the thickness factor of the layer arrangement at locations of the mirror surface correlates with the maximum angle of incidence that occurs there, since, for a higher maximum angle of incidence, a higher thickness factor is useful for the adaptation.

In another embodiment, the substrate of the mirror consists of a metal or a metal alloy, in particular Si, Glidcop® or Elmedur®. Glidcop® is a registered trade name of SCM Metal Products, Inc. for dispersion-hardened Si alloys comprising different admixtures of aluminium oxide ceramic particles. Elmedur® is a registered trade name of DURO METALL GmbH for copper alloys comprising proportions of approximately 1% Co, 1% Ni and 0.5% Be. Such materials are used in particular for the production of so-called facet mirrors for the EUV wavelength range. In the case of said facet mirrors, which are generally used in the illumination system of projection exposure apparatuses for microlithography, it is particularly important to reduce the stray light losses, since said mirrors are used very close to the light source and, therefore, the light losses thereof have a greater effect on the total transmission of the projection exposure apparatus.

Furthermore, the object is achieved through another formulation of the invention with a projection objective comprising at least one mirror according to the invention.

Moreover, the object of the invention is achieved with a projection exposure apparatus according to the invention for microlithography comprising such a projection objective.

Furthermore the object of the invention is achieved by the use of graphene on optical elements for reducing the surface roughness to less than 0.1 nm rms HSFR and/or by the use of graphene for protecting the optical element in the EUV wavelength range against a radiation-induced irreversible change in volume of more than 1% and/or by the use of graphene as a barrier layer for preventing interdiffusion between layers of so-called multilayer layer mirrors in the EUV wavelength range.

Further features and advantages of the invention will become apparent from the following description of exemplary embodiments of the invention with reference to the figures, which show details essential to the invention, and from the claims. The individual features can be realized in each case individually by themselves or as a plurality in any desired combination in a variant of the invention.

BRIEF DESCRIPTION OF THE DRAWINGS

Exemplary embodiments of the invention are explained in greater detail below with reference to the figures, in which:

FIG. 1a shows a schematic illustration of the first mirror according to the invention with a surface protecting layer SPL and layer composed of graphene G;

DETAILED DESCRIPTION OF PREFERRED EMBODIMENTS

A respective mirror 1a, 1a', 1b, 1b', 1c and 1c' according to the invention is described below with reference to FIGS. 1, 1a, 2, 2a, 3 and 3a, the corresponding features of the mirrors having the same reference signs in the figures. Furthermore, the corresponding features or properties of these mirrors according to the invention are explained in summary for FIGS. 1 to 3a below following the description concerning FIG. 3a.

Figure 1:
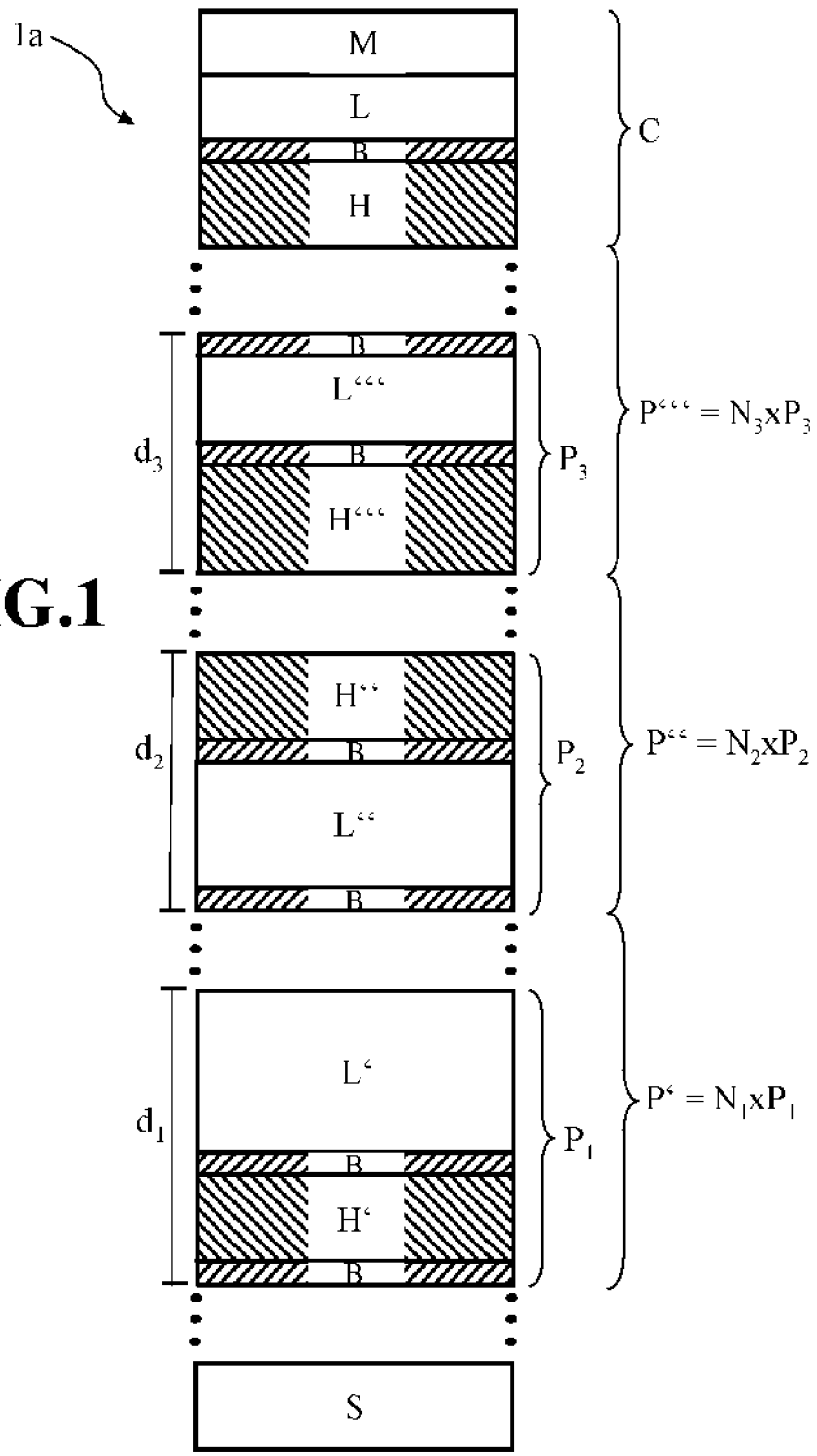
FIG. 1 shows a schematic illustration of a first mirror according to the invention.

FIG. 1 shows a schematic illustration of a mirror 1a according to the invention for the EUV wavelength range comprising a substrate S and a layer arrangement. In this case, the layer arrangement comprises a plurality of surface layer systems P', P'' and P''' each consisting of a periodic sequence of at least two periods $P_1$, $P_2$ and $P_3$ of individual layers, wherein the periods $P_1$, $P_2$ and $P_3$ comprise two individual layers composed of different materials for a high refractive index layer H', H'' and H''' and a low refractive index layer L', L" and L'" and have within each surface layer system P', P" and P'" a constant thickness $d_1$, $d_2$ and $d_3$ that deviates from a thickness of the periods of an adjacent surface layer system. In this case, the surface layer system P'" that is most distant from the substrate has a number $N_3$ of periods $P_3$ that is greater than the number $N_2$ of periods $P_2$ for the surface layer system P" that is second most distant from the substrate. In addition, the surface layer system P'" that is second most distant from the substrate has a sequence of the periods $P_2$ such that the first high refractive index layer H'" of the surface layer system P'" that is most distant from the substrate directly succeeds the last high refractive index layer H" of the surface layer system P" that is second most distant from the substrate.

Consequently, in FIG. 1, the order of the high H" and low refractive index L" layers within the periods $P_2$ in the surface layer system P" that is second most distant from the substrate is reversed relative to the order of the high H', H'" and low refractive index L', L" layers within the other periods $P_1$, $P_3$ of the other surface layer systems P', P'", such that the first low refractive index layer L" of the surface layer system P" that is second most distant from the substrate also optically actively succeeds the last low refractive index layer L' of the surface layer system P' that is situated closest to the substrate. Therefore, the surface layer system P" that is second most distant from the substrate in FIG. 1 also differs in the order of the layers from all the other surface layer systems in FIGS. 2 and 3 that are described below.

FIG. 1a shows the mirror 1a' according to the invention, said mirror substantially corresponding to the mirror 1a according to the invention in FIG. 1. The difference between these mirrors is merely that, in the case of the mirror 1a', a surface protecting layer SPL having the thickness $d_p$ and a layer G composed of graphene is situated between the upper three surface layer systems P', P" and P'" and the substrate S. Such a surface protecting layer SPL serves to protect the substrate from excessively high doses of EUV radiation since mirror substrates composed of e.g. Zerodur® or ULE® exhibit an irreversible densification of the order of magnitude of a few percent by volume at high doses of EUV radiation. The layer composed of graphene G provides for compensation of the surface roughness of the surface protecting layer SPL, such that stray light losses are avoided. In this case, a mirror surface protecting layer SPL composed of a metal such as e.g. nickel (Ni) having a thickness of approximately 50 to 100 nm has enough absorption, such that only very little EUV radiation penetrates as far as the underlying substrate S. The substrate is thereby sufficiently protected even at high doses of EUV radiation which occur during operation of a microlithography apparatus over many years. It is thus possible to prevent the situation where the optical imaging properties of a mirror no longer suffice for the operation of the microlithography apparatus after just a few months or years on account of the irreversible change in the surface of the substrate.

A 2 to 5 μm thick quartz layer as a surface protecting layer SPL likewise has enough absorption to sufficiently protect the substrate. Such a quartz layer should be applied on the substrate using a CVD method, in particular a PICVD, PACVD or PECVD method, since these coating methods mentioned lead to very compact layers which, even under EUV radiation, are stable and do not exhibit irreversible densification. The metal layers mentioned, such as e.g. nickel, are likewise stable under EUV radiation and do not exhibit irreversible densification.

The explanation as to why quartz layers, in contrast to the substrate material, are stable under high doses of EUV radiation even though the substrate materials are likewise based on the basic material quartz presumably resides in the process for producing the substrate materials, which takes place at high temperatures. As a result, presumably an intermediate thermodynamic state is frozen in the substrate material, this state undergoing transition to a thermodynamic ground state under high doses of EUV radiation, as a result of which the substrate material becomes more compact. Conversely, the quartz layers are applied at low temperatures with the methods mentioned, as a result of which presumably a thermodynamic ground state of the material is realized from the outset, and said state cannot be converted into a further ground state at a thermodynamically lower level as a result of high doses of EUV radiation.

As an alternative to a single surface protecting layer SPL, it is also possible to design a surface layer system P' of the mirror 1a from FIG. 1 in such a way that it affords sufficient protection for the underlying substrate on account of its absorption. For this purpose, the surface layer system should have a corresponding number of layers. In particular, a surface layer system P' having a number of periods that exceeds the number of periods of the surface layer systems P" and P'" of a layer arrangement for an EUV mirror is suitable for this purpose.

In this case, the reflectivity properties, the transmission properties and the stress properties of all the layers simultaneously have to be taken into account during each overall optimization of a layer arrangement.

Figure 2:
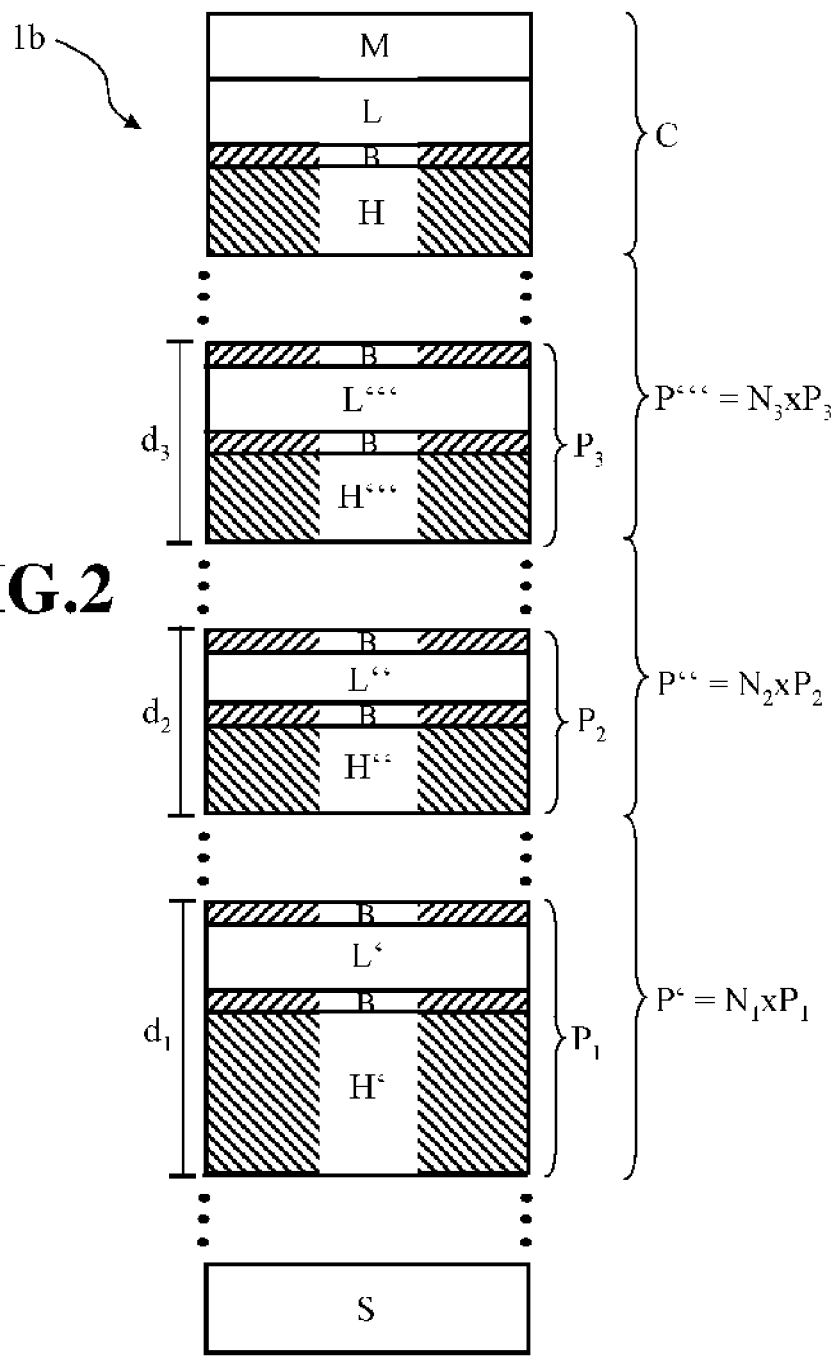
FIG. 2 shows a schematic illustration of a second mirror according to the invention.
Figure 2A:
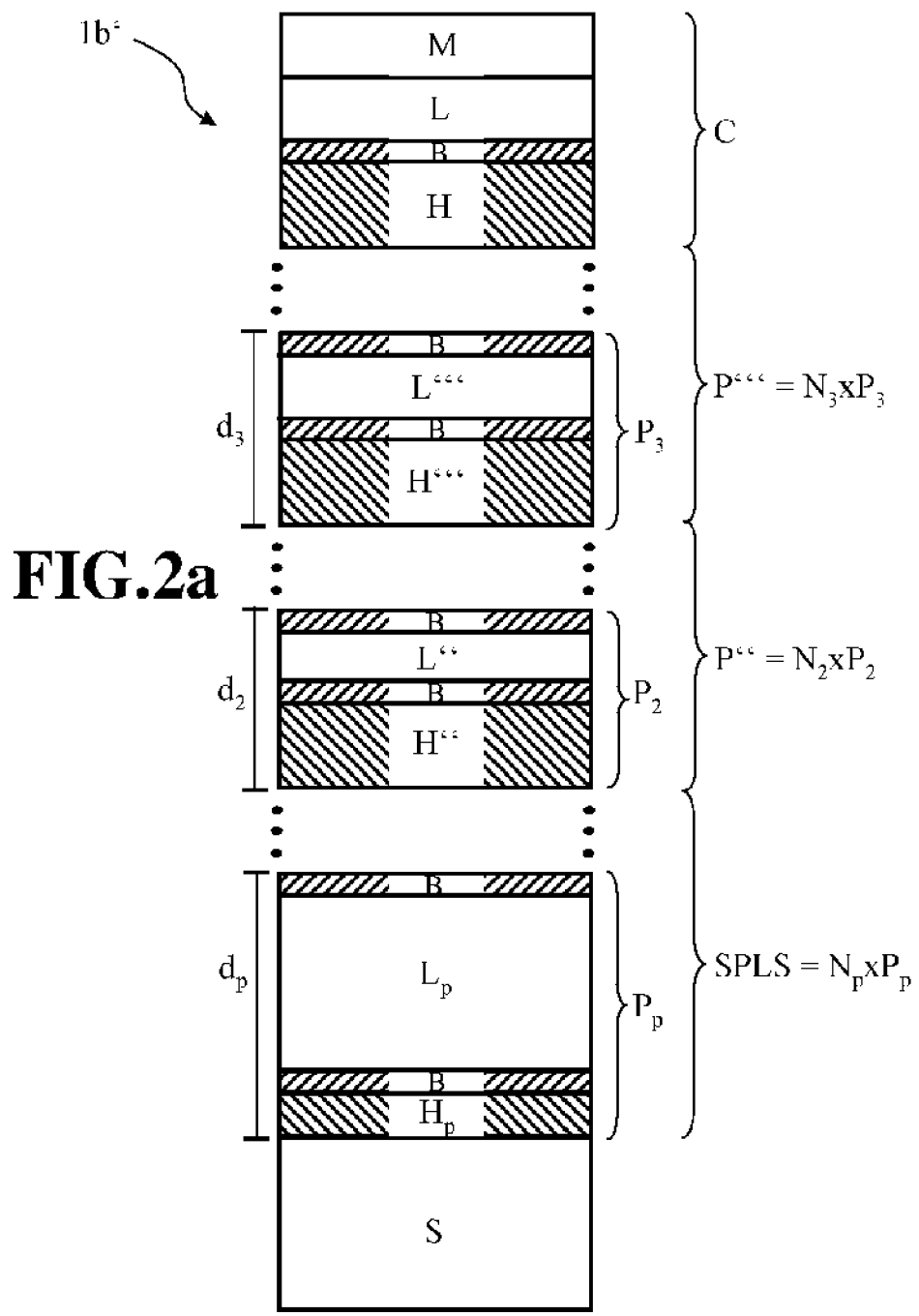
FIG. 2a shows a schematic illustration of the second mirror according to the invention with a surface protecting layer system SPLS.
Figure 3:
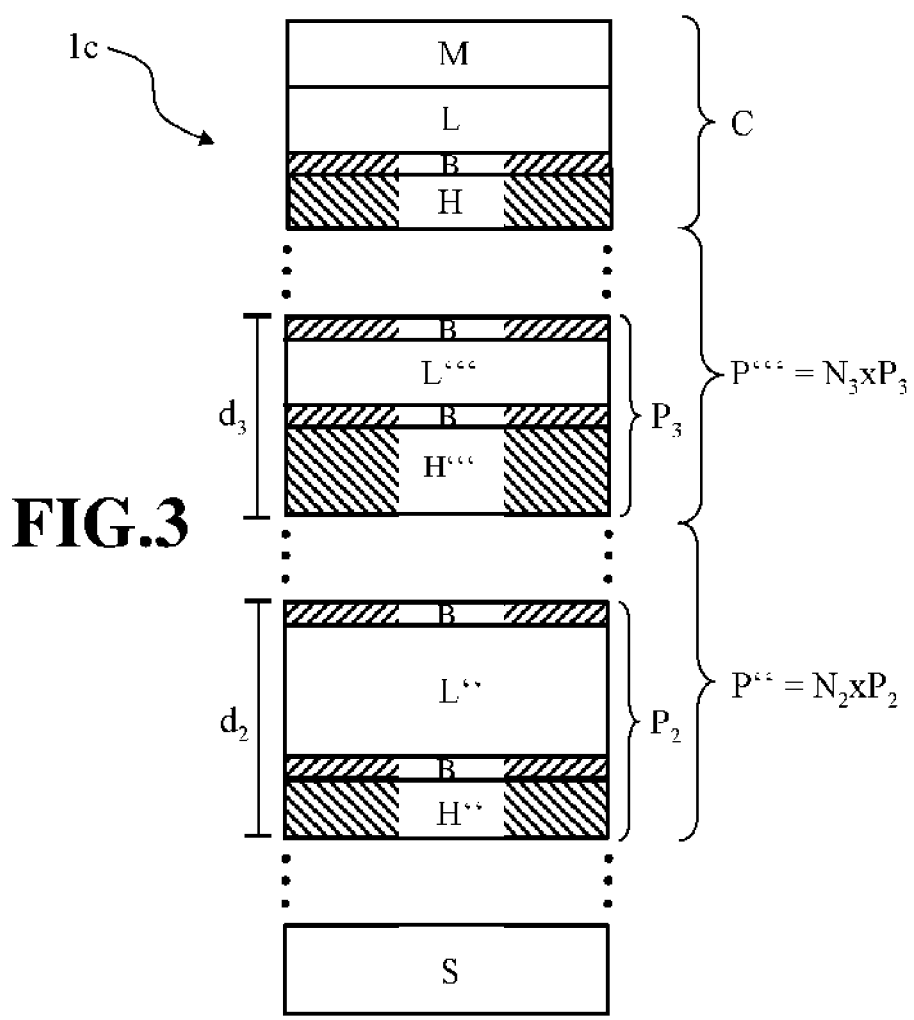
FIG. 3 shows a schematic illustration of a third mirror according to the invention.
Figure 3A:
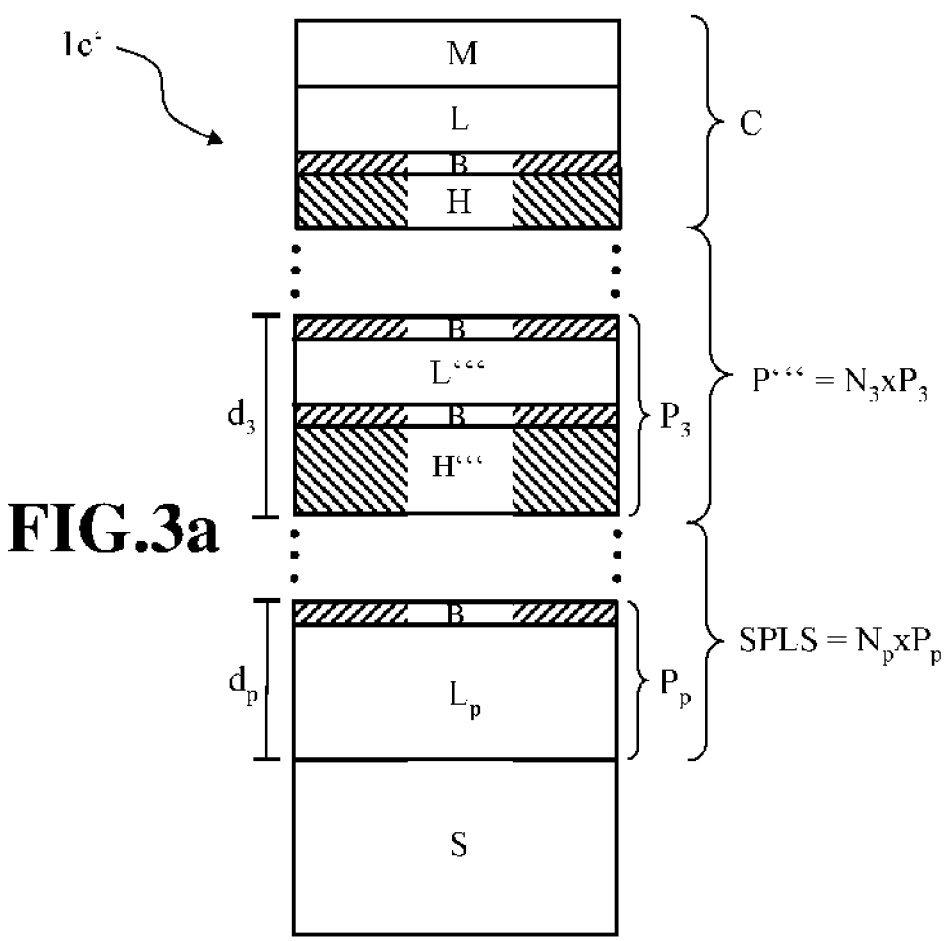
FIG. 3a shows a schematic illustration of the third mirror according to the invention with a surface protecting layer system SPLS.

Specific surface protecting layer systems SPLS as discussed below with reference to FIGS. 2a and 3a are likewise suitable for sufficiently protecting the substrate of the mirror 1a in FIG. 1 from EUV radiation. In this case, at least one layer composed of graphene G, B is used for smoothing the surface. Furthermore, it is possible to use layers composed of graphene G, B both in the surface protecting layer system SPLS in FIGS. 2a and 3a and in the surface layer systems in FIGS. 1 to 3a as so-called barrier layers that prevent the interdiffusion of adjacent layers.

In this case, a layer composed of graphene G, B consists at least of a monolayer composed of graphene. In this case, monolayers or bilayers composed of graphene can be disregarded in the implementation of the layer design with regard to their refractive index. By contrast, the layers G, B should be taken into account in the layer design starting from a thickness of approximately four monolayers of graphene. Since no values are known for the refractive index of a few layers composed of graphene at 13.5 nm, the values of graphite such as are reproduced in Table 2a should be used for the implementation of layer designs.

Layers composed of graphene can be deposited on areas, or transferred thereto, in any desired size in accordance with the method specified in WO 2009/129194. In the case of quartz or nickel layers as SPL or SPLS according to the present invention, direct CVD deposition from WO 2009/129194 is appropriate. This gives rise to layers composed of graphene which comprise both monolayers and multilayers composed of graphene. It is thereby possible to compensate for the unevennesses of the layer situated directly below the graphene. Furthermore, such layers are "atomically smooth", see the discussion of the roughness of a layer composed of graphene G, B with reference to FIGS. 16 to 23. Alternatively, multilayers composed of graphene can be deposited directly onto mirror substrates composed of Si, Cu or alloys thereof in accordance with WO 2009/129194 and can act as an SPL. For this purpose, however, the further surface layer systems of the layer arrangement have to be designed accordingly with regard to transmission, since graphene is not absorbent to the same extent as nickel, for example, see Table 2a. Alternatively, multilayers composed of graphene can also be deposited on a quartz layer in accordance with WO 2009/129194 and can act together with the latter as an SPL.

FIG. 2 shows a schematic illustration of a mirror 1b according to the invention for the EUV wavelength range comprising a substrate S and a layer arrangement. In this case, the layer arrangement comprises a plurality of surface layer systems P', P" and P'" each consisting of a periodic sequence of at least two periods $P_1$, $P_2$ and $P_3$ of individual layers, wherein the periods $P_1$, $P_2$ and $P_3$ comprise two individual layers composed of different materials for a high refractive index layer H', H" and H'" and a low refractive index layer L', L" and L'" and have within each surface layer system P', P" and P'" a constant thickness $d_1$, $d_2$ and $d_3$ that deviates from a thickness of the periods of an adjacent surface layer system. In this case, the surface layer system P'" that is most distant from the substrate has a number $N_3$ of periods $P_3$ that is greater than the number $N_2$ of periods $P_2$ for the surface layer system P" that is second most distant from the substrate. In this case, unlike in the case of the exemplary embodiment concerning FIG. 1, the surface layer system P" that is second most distant from the substrate has a sequence of the periods $P_2$ which corresponds to the sequence of the periods $P_1$ and $P_3$ of the other surface layer systems P' and P'", such that the first high refractive index layer H'" of the surface layer system P'" that is most distant from the substrate optically actively succeeds the last low refractive index layer L" of the surface layer system P" that is second most distant from the substrate.

FIG. 2a shows a mirror 1b' according to the invention corresponding to the mirror 1b according to the invention in FIG. 2, the third surface layer system P' of which is designed as a surface protecting layer system SPLS. In this case, the surface protecting layer system SPLS comprises a plurality of periods of a high refractive index layer $H_p$, a low refractive index layer $L_p$ and two barrier layers B. In this case, the low refractive index layer consists of a metal, such as e.g. nickel or cobalt, and accordingly has a high absorption for EUV radiation, see Table 2a.

In this case, the total thickness of the layers Lp of the surface protecting layer system SPLS corresponds approximately to the thickness of the surface protecting layer SPL in accordance with the mirror 1a' according to the invention from FIG. 1a. A surface protecting layer SPL in accordance with the exemplary embodiment 1a' in FIG. 1a can be used between the layer arrangement of the mirror 1b and the substrate or as a replacement of the surface protecting layer system SPLS of the mirror 1b' in FIG. 2a.

The advantage of a surface protecting layer system SPLS over an individual surface protecting layer SPL is that possible crystal growth of the metal layers is prevented by the high refractive index layers. Such crystal growth leads to rough surfaces of the metal layers and this in turn leads to undesired stray light losses, as already mentioned in the introduction. Silicon as material of a high refractive index layer of a period is suitable for the metal nickel, whereas beryllium as high refractive index layer is suitable for the metal cobalt.

In order to prevent interdiffusion of these layers mentioned, it is possible to use barrier layers B such as are discussed in further association with other high and low refractive index layers in the context of this application. In particular layers composed of graphene as barrier layers B firstly prevent interdiffusion and secondly lead to "atomically smooth" surfaces, see the discussion concerning FIGS. 16 to 23.

FIG. 3 shows a schematic illustration of a further mirror 1c according to the invention for the EUV wavelength range comprising a substrate S and a layer arrangement. In this case, the layer arrangement comprises a plurality of surface layer systems P" and P'" each consisting of a periodic sequence of at least two periods $P_2$ and $P_3$ of individual layers, wherein the periods $P_2$ and $P_3$ comprise two individual layers composed of different materials for a high refractive index layer H" and H'" and a low refractive index layer L" and L'" and have within each surface layer system P" and P'" a constant thickness $d_2$ and $d_3$ that deviates from a thickness of the periods of an adjacent surface layer system. In this case, in a fourth exemplary embodiment in accordance with the description concerning FIGS. 14 and 15, the surface layer system P'" that is most distant from the substrate has a number $N_3$ of periods $P_3$ that is greater than the number $N_2$ of periods $P_2$ for the surface layer system P" that is second most distant from the substrate. This fourth exemplary embodiment also comprises, as a variant with respect to the illustration of the mirror 1c in FIG. 3 corresponding to mirror 1a, the reversed order of the layers in the surface layer system P" that is second most distant from the substrate S, such that this fourth exemplary embodiment also has the feature that the first high refractive index layer H'" of the surface layer system P'" that is most distant from the substrate optically actively succeeds the last low refractive index layer L" of the surface layer system P" that is second most distant from the substrate.

Particularly in the case of a small number of surface layer systems of, for example, just two surface layer systems, it is found that high reflectivity values are obtained if the period $P_3$ for the surface layer system P'" that is most distant from the substrate has a thickness of the high refractive index layer H'" which amounts to more than 120% of the thickness, in particular more than double the thickness, of the high refractive index layer H" of the period $P_2$ for the surface layer system P" that is second most distant from the substrate.

FIG. 3a shows a schematic illustration of a further mirror 1c' according to the invention, said mirror differing from the mirror 1c in FIG. 3 in that the surface layer system P" that is situated closest to the substrate is embodied as a surface protecting layer system SPLS. In FIG. 3a, said surface protecting layer system SPLS merely consists of layers $L_p$ interrupted by barrier layers B. The barrier layers B serve, as already discussed above concerning FIG. 2a, to interrupt the crystal growth of the layers $L_p$. The surface protecting layer system SPLS illustrated in FIG. 3a can be replaced by other surface protecting layers SPL or other surface protecting layer systems SPLS as discussed in association with FIG. 1a and FIG. 2a. In this case, the surface protecting layer system SPLS illustrated in FIG. 3a merely represents a simplified surface protecting layer system SPLS by comparison with the surface protecting layer system illustrated in FIG. 2a, in which the high refractive index layers $H_p$ have been dispensed with.

Consequently, the surface protecting layer system SPLS in FIG. 3a corresponding to the surface protecting layer SPL in FIG. 1a is restricted purely to the protection function for the substrate (S) by absorption and therefore has only little interaction with regard to the optical properties of the other surface layer systems. By contrast, the surface protecting layer system in FIG. 2a has a double function by virtue of the fact that, owing to its absorption properties, it provides for the protection of the substrate and by virtue of the fact that, owing to its reflection properties, it contributes to the reflection and thus to the optical performance of the mirror. The transition in the designation of a layer system from a surface protecting layer system SPLS to a surface layer system P', P" or P'" of the layer arrangement is fluid here since, as already discussed above in association with FIG. 1a, a surface layer system P' of the mirror 1a, given a corresponding design with a multiplicity of periods, also both contributes to the reflectivity effect of the mirror and undertakes a protective effect with respect to the substrate on account of the increased absorption of the multiplicity of periods. In contrast to the reflectivity, all of the layers of a layer arrangement have to be taken into account when considering the layer stresses of a layer design.

The surface layer systems of the layer arrangement of the mirrors according to the invention with respect to FIGS. 1, 2 and 3 succeed one another directly and are not separated by a further layer system. However, separation of the surface layer systems by an individual intermediate layer is conceivable for adapting the surface layer systems to one another or for optimizing the optical properties of the layer arrangement. This last does not apply, however, to the two surface layer systems P" and P'" of the first exemplary embodiment with respect to FIG. 1 and the fourth exemplary embodiment as a variant with respect to FIG. 3 since the desired optical effect would thereby be prevented by the reversal of the sequence of the layers in P".

The layers designated by H, $H_p$, H', H" and H'" in FIGS. 1 to 3a are layers composed of materials which, in the EUV wavelength range, can be designated as high refractive index layers in comparison with the layers of the same surface layer system which are designated as L, $L_p$, L', L" and L'", see the complex refractive indices of the materials in Table 2 and Table 2a. Conversely, the layers designated by L, $L_p$, L', L" and L'" in FIGS. 1 to 3a are layers composed of materials which, in the EUV wavelength range, can be designated as low refractive index layers in comparison with the layers of the same surface layer system which are designated as H, $H_p$, H', H" and H'". Consequently, the terms high refractive index and low refractive index are relative terms with regard to the respective partner layer in a period of a surface layer system. Surface layer systems function generally only if a layer that acts optically with a high refractive index is combined with a layer that optically has a lower refractive index relative thereto, as main constituent of a period of the surface layer system. The material silicon is generally used for high refractive index layers. In combination with silicon, the materials molybdenum and ruthenium should be designated as low refractive index layers, see the complex refractive indices of the materials in Table 2.

In FIGS. 1 to 3a, a barrier layer B is in each case situated between the individual layers of a period, said barrier layer consisting of a material which is selected from or as a compound is composed of the group of materials: $B_4C$, C, graphene, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast in the transition of the two individual layers. With the use of the materials molybdenum and silicon for the two individual layers of a period, one barrier layer above the silicon layer, as viewed from the substrate, suffices in order to provide for a sufficient contrast.

The second barrier layer above the molybdenum layer can be dispensed with in this case. In this respect, at least one barrier layer for separating the two individual layers of a period should be provided, wherein the at least one barrier layer may perfectly well be constructed from various ones of the above-indicated materials or the compounds thereof and may in this case also exhibit a layered construction of different materials or compounds.

Barrier layers which comprise the material $B_4C$ and have a thickness of between 0.35 nm and 0.8 nm, preferably between 0.4 nm and 0.6 nm, lead in practice to high reflectivity values of the layer arrangement. Particularly in the case of surface layer systems composed of ruthenium and silicon, barrier layers composed of $B_4C$ exhibit a maximum of reflectivity in the case of values of between 0.4 nm and 0.6 nm for the thickness of the barrier layer.

Barrier layers composed of graphene lead to very smooth surfaces and thus reduce stray light losses.

In the case of the mirrors 1a, 1a', 1b, 1b', 1c and 1c' according to the invention, the number $N_p$, $N_1$, $N_2$ and $N_3$ of periods $P_p$, $P_1$, $P_2$ and $P_3$ of the surface layer systems SPLS, P', P" and P'" can comprise in each case up to 100 periods of the individual periods $P_p$, $P_1$, $P_2$ and $P_3$ illustrated in FIGS. 1 to 3a. Furthermore, between the layer arrangements illustrated in FIGS. 1 to 3a and the substrate S, an additional intermediate layer or an additional intermediate layer arrangement can be provided, which serves for the stress compensation of the layer arrangement with respect to the substrate.

The same materials in the same sequence as for the layer arrangement itself can be used as materials for the additional intermediate layer or the additional intermediate layer arrangement for stress compensation. In the case of the intermediate layer arrangement, however, it is possible to dispense with the barrier layer between the individual layers since the intermediate layer or the intermediate layer arrangement generally makes a negligible contribution to the reflectivity of the mirror and so the issue of an increase in contrast by the barrier layer is unimportant in this case. Multilayer arrangements composed of alternating chromium and scandium layers or amorphous molybdenum or ruthenium layers would likewise be conceivable as the additional intermediate layer or intermediate layer arrangement for stress compensation.

The latter can likewise be chosen in terms of their thickness, e.g. greater than 20 nm, such that an underlying substrate is sufficiently protected from EUV radiation. In this case, the additional intermediate layer or the additional intermediate layer arrangement would likewise act as a surface protecting layer SPL or as a surface protecting layer system SPLS, respectively, and protect the substrate from EUV radiation.

The layer arrangements of the mirrors 1a, 1a', 1b, 1b', 1c and 1c' according to the invention are terminated in FIGS. 1 to 3a by a covering layer system C comprising at least one layer composed of a chemically inert material such as e.g. Rh, Pt, Ru, Pd, Au, SiO2 etc. as a terminating layer M. Said terminating layer M thus prevents the chemical alteration of the mirror surface on account of ambient influences. The covering layer system C in FIGS. 1 to 3a consists, besides the terminating layer M, of a high refractive index layer H, a low refractive index layer L and a barrier layer B.

The thickness of one of the periods $P_p$, $P_1$, $P_2$ and $P_3$ results from FIGS. 1 to 3a as the sum of the thicknesses of the individual layers of the corresponding period, that is to say from the thickness of the high refractive index layer, the thickness of the low refractive index layer and the thickness of two barrier layers. Consequently, the surface layer systems SPLS, P', P" and P'" in FIGS. 1 to 3a, given the same choice of material, can be distinguished from one another by virtue of the fact that their periods $P_p$, $P_1$, $P_2$ and $P_3$ have a different thickness $d_1$, $d_2$ and $d_3$. Consequently, in the context of the present invention, different surface layer systems SPLS, P', P'' and P''' given the same choice of material are understood to be surface layer systems whose produced periods $P_p$, $P_1$, $P_2$ and $P_3$ differ by more than 0.1 nm in their thicknesses $d_1$, $d_2$ and $d_3$, since a different optical effect of the surface layer systems can no longer be assumed below a difference of 0.1 nm given otherwise identical division of the periods between high and low refractive index layers. Furthermore, inherently identical surface layer systems can fluctuate by this absolute value in their period thicknesses during their production on different production apparatuses. For the case of a surface layer system SPLS, P', P'' and P''' having a period composed of molybdenum and silicon, it is also possible, as already described above, to dispense with the second barrier layer within the period $P_p$, $P_1$, $P_2$ and $P_3$, such that in this case the thickness of the periods $P_p$, $P_1$, $P_2$ and $P_3$ results from the thickness of the high refractive index layer, the thickness of the low refractive index layer and the thickness of a barrier layer.

Figure 4:
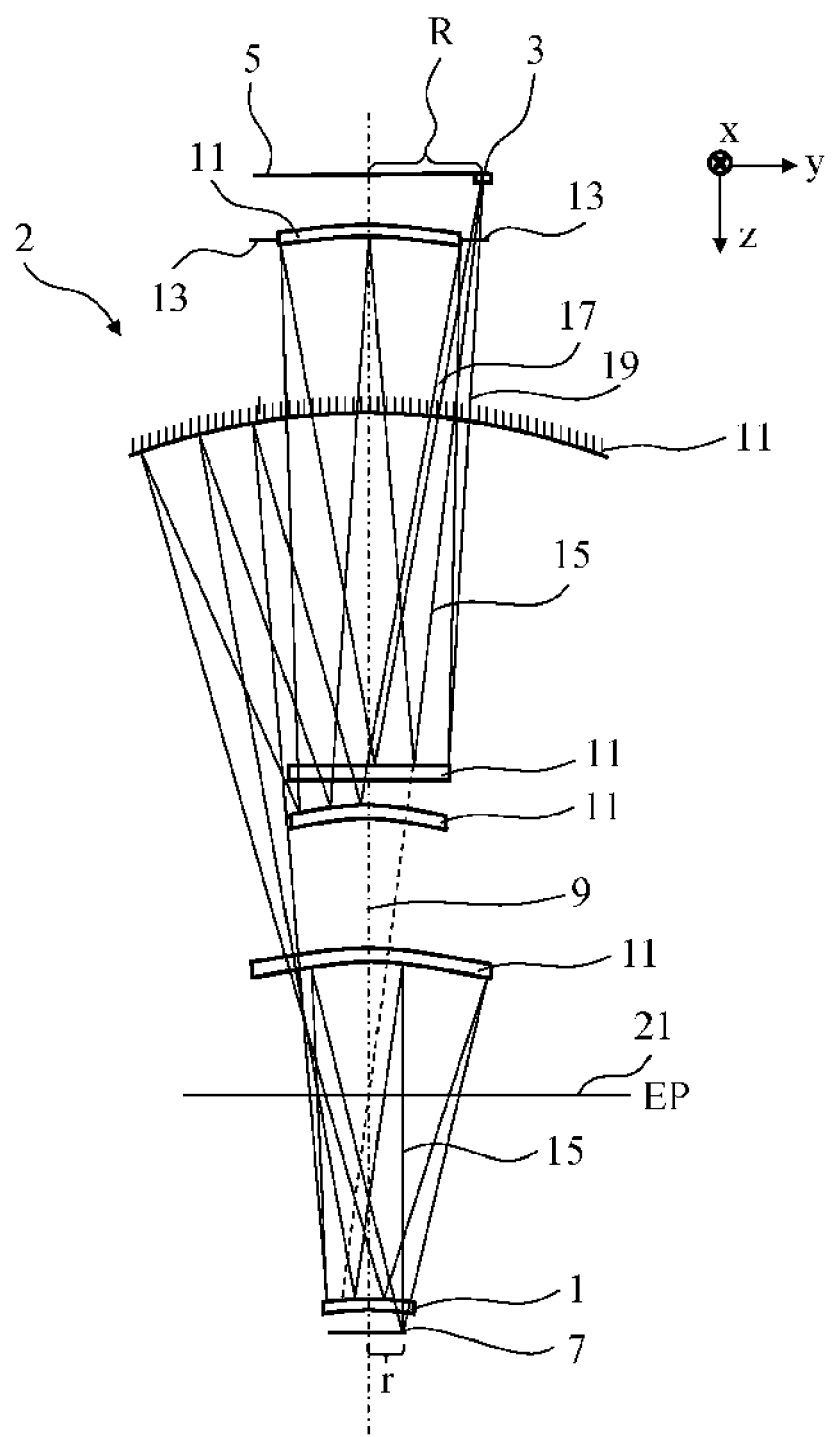
FIG. 4 shows a schematic illustration of a projection objective according to the invention for a projection exposure apparatus for microlithography.

FIG. 4 shows a schematic illustration of a projection objective 2 according to the invention for a projection exposure apparatus for microlithography having six mirrors 1, 11, including at least one mirror 1 configured on the basis of the mirrors 1a, 1a', 1b, 1b', 1c and 1c' according to the invention in accordance with the exemplary embodiments with respect to FIGS. 8 to 15. The task of a projection exposure apparatus for microlithography is to image the structures of a mask, which is also referred to as a reticle, lithographically onto a so-called wafer in an image plane. For this purpose, a projection objective 2 according to the invention in FIG. 4 images an object field 3, which is arranged in the object plane 5, into an image field in the image plane 7. The structure-bearing mask, which is not illustrated in the drawing for the sake of clarity, can be arranged at the location of the object field 3 in the object plane 5. For orientation purposes, FIG. 4 illustrates a system of Cartesian coordinates, the x-axis of which points into the plane of the figure. In this case, the x-y coordinate plane coincides with the object plane 5, the z-axis being perpendicular to the object plane 5 and pointing downward. The projection objective has an optical axis 9, which does not run through the object field 3. The mirrors 1, 11 of the projection objective 2 have a design surface that is rotationally symmetrical with respect to the optical axis. In this case, said design surface must not be confused with the physical surface of a finished mirror, since the latter surface is trimmed relative to the design surface in order to ensure passages of light past the mirror. In this exemplary embodiment, the aperture stop 13 is arranged on the second mirror 11 in the light path from the object plane 5 to the image plane 7. The effect of the projection objective 2 is illustrated with the aid of three rays, the principal ray 15 and the two aperture marginal rays 17 and 19, all of which originate in the center of the object field 3. The principal ray 15, which runs at an angle of 6° with respect to the perpendicular to the object plane, intersects the optical axis 9 in the plane of the aperture stop 13. As viewed from the object plane 5, the principal ray 15 appears to intersect the optical axis in the entrance pupil plane 21. This is indicated in FIG. 4 by the dashed extension of the principal ray 15 through the first mirror 11. Consequently, the virtual image of the aperture stop 13, the entrance pupil, lies in the entrance pupil plane 21. The exit pupil of the projection objective could likewise be found with the same construction in the backward extension of the principal ray 15 proceeding from the image plane 7. However, in the image plane 7 the principal ray 15 is parallel to the optical axis 9, and from this it follows that the backward projection of these two rays produces a point of intersection at infinity in front of the projection objective 2 and the exit pupil of the projection objective 2 is thus at infinity. Therefore, this projection objective 2 is a so-called objective that is telecentric on the image side. The center of the object field 3 is at a distance R from the optical axis 9 and the center of the image field 7 is at a distance r from the optical axis 9, in order that no undesirable vignetting of the radiation emerging from the object field occurs in the case of the reflective configuration of the projection objective.

Figure 5:
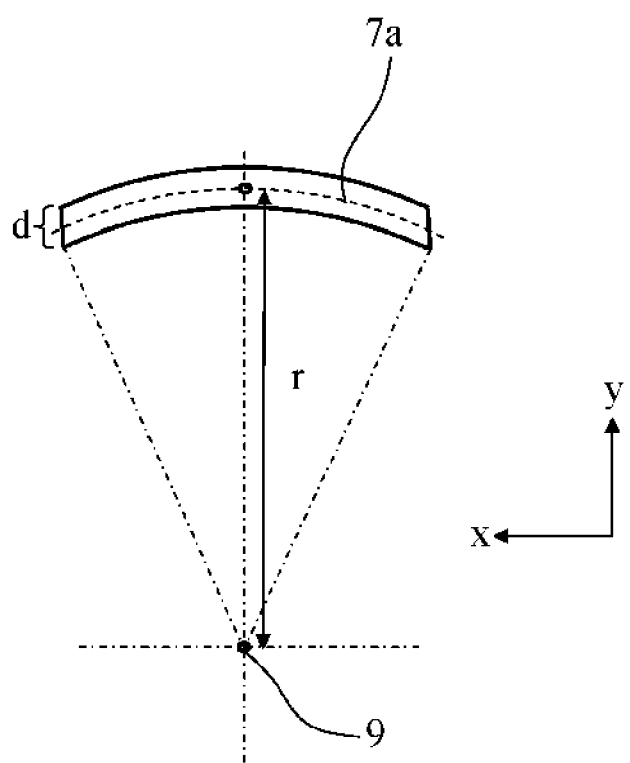
FIG. 5 shows a schematic illustration of the image field of the projection objective.

FIG. 5 shows a plan view of an arcuate image field 7a such as occurs in the projection objective 2 illustrated in FIG. 4, and a system of Cartesian coordinates, the axes of which correspond to those from FIG. 4. The image field 7a is a sector from an annulus, the center of which is given by the point of intersection of the optical axis 9 with the object plane. The average radius r is 34 mm in the case illustrated. The width of the field in the y-direction d is 2 mm here. The central field point of the image field 7a is marked as a small circle within the image field 7a. As an alternative, a curved image field can also be delimited by two circle arcs which have the same radius and are displaced relative to one another in the y-direction. If the projection exposure apparatus is operated as a scanner, then the scanning direction runs in the direction of the shorter extent of the object field, that is to say in the direction of the y-direction.

Figure 6:
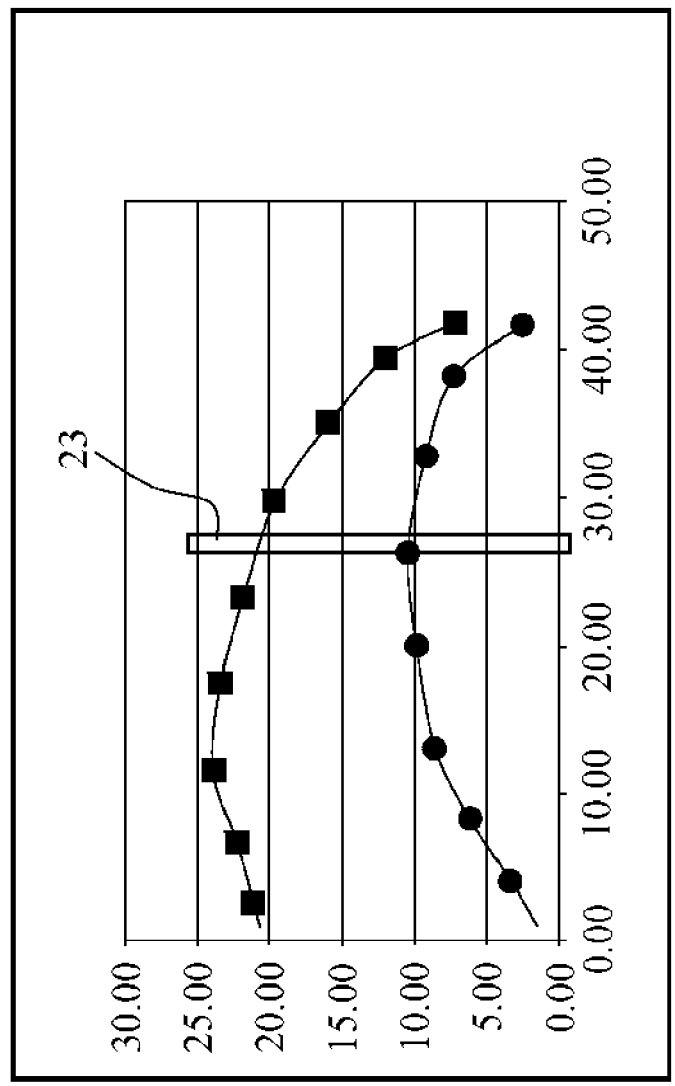
FIG. 6 shows an exemplary illustration of the maximum angles of incidence and the interval lengths of the angle of incidence intervals against the distance of the locations of a mirror according to the invention with respect to the optical axis within a projection objective.

FIG. 6 shows an exemplary illustration of the maximum angles of incidence (rectangles) and of the interval lengths of the angle of incidence intervals (circles) in the unit degrees [°] against different radii or distances between the locations of the mirror surface and the optical axis, indicated in the unit [mm], of the penultimate mirror 1 in the light path from the object plane 5 to the image plane 7 of the projection objective 2 from FIG. 4. Said mirror 1, in the case of a projection objective 2 for microlithography which has six mirrors 1, 11 for the EUV wavelength range, is generally that mirror which has to ensure the largest angles of incidence and the largest angle of incidence intervals or the greatest variation of angles of incidence. In the context of this application, the interval length of an angle of incidence interval as a measure of the variation of angles of incidence is understood to be the number of angular degrees of that angular range in degrees between the maximum and minimum angles of incidence which the coating of the mirror has to ensure for a given distance from the optical axis on account of the requirements of the optical design. The angle of incidence interval will also be abbreviated to AOI interval.

The optical data of the projection objective in accordance with Table 1 are applicable in the case of the mirror 1 on which FIG. 6 is based. In this case, the aspheres of the mirrors 1, 11 of the optical design are specified as rotationally symmetrical surfaces utilizing the perpendicular distance Z(h) of an asphere point relative to the tangential plane in the asphere vertex as a function of the perpendicular distance h of the asphere point with respect to the normal in the asphere vertex in accordance with the following asphere equation:

$$Z(h)=(rho*h^2)/(1+[1-(1+k_y)*(rho*h)^2]^{0.5})++c_1*h^4+c_2*h^6+c_3*h^8+c_4*h^{10}+c_5*h^{12}+c_6*h^{14}$$

with the radius $R=1/rho$ of the mirror and the parameters $k_y$, $c_1$, $c_2$, $c_3$, $c_4$, $c_5$, and $c_6$ in the unit [mm]. In this case, said parameters are normalized with regard to the unit [mm] in accordance with [$1/mm^{2n+2}$] in such a way as to result in the asphere Z(h) as a function of the distance h also in the unit [mm].

penultimate mirror before the image plane 7 in accordance with FIG. 4 and the design in Table 1 lead to high values for the pupil apodization. In this case, there is a correlation

TABLE 1

Data of the optical design regarding the angles of incidence of the mirror 1 in FIG. 6 in accordance with the schematic illustration of the design on the basis of FIG. 4.

| Designation of the surface in accordance with FIG. 2 | Radius R in [mm] | Distance from the nearest surface in [mm] | Asphere parameters with the unit [$1/mm^{2n+2}$] for $c_n$ |
|---|---|---|---|
| Object plane 5 | infinity | 697.657821079643 | |
| 1st mirror 11 | −3060.189398512395 | 494.429629463009 | $k_y$ = 0.00000000000000E+00 |
| | | | $c_1$ = 8.46747658600840E−10 |
| | | | $c_2$ = −6.38829035308911E−15 |
| | | | $c_3$ = 2.99297298249148E−20 |
| | | | $c_4$ = 4.89923345704506E−25 |
| | | | $c_5$ = −2.62811636654902E−29 |
| | | | $c_6$ = 4.29534493103729E−34 |
| 2nd mirror 11 -- diaphragm -- | −1237.831140064837 | 716.403660000000 | $k_y$ = 3.05349335818189E+00 |
| | | | $c_1$ = 3.01069673080653E−10 |
| | | | $c_2$ = 3.09241275151742E−16 |
| | | | $c_3$ = 2.71009214786939E−20 |
| | | | $c_4$ = −5.04344434347305E−24 |
| | | | $c_5$ = 4.22176379615477E−28 |
| | | | $c_6$ = −1.41314914233702E−32 |
| 3rd mirror 11 | 318.277985359899 | 218.770165786534 | $k_y$ = −7.80082610035452E−01 |
| | | | $c_1$ = 3.12944645776932E−10 |
| | | | $c_2$ = −1.32434614339199E−14 |
| | | | $c_3$ = 9.56932396033676E−19 |
| | | | $c_4$ = −3.13223523243916E−23 |
| | | | $c_5$ = 4.73030659773901E−28 |
| | | | $c_6$ = −2.70237216494288E−33 |
| 4th mirror 11 | −513.327287349838 | 892.674538915941 | $k_y$ = −1.05007411819774E−01 |
| | | | $c_1$ = −1.33355977877878E−12 |
| | | | $c_2$ = −1.71866658951357E−16 |
| | | | $c_3$ = 6.69985430179187E−22 |
| | | | $c_4$ = 5.40777151247246E−27 |
| | | | $c_5$ = −1.16662974927332E−31 |
| | | | $c_6$ = 4.19572235940121E−37 |
| Mirror 1 | 378.800274177878 | 285.840721874570 | $k_y$ = 0.00000000000000E+00 |
| | | | $c_1$ = 9.27754883183223E−09 |
| | | | $c_2$ = 5.96362556484499E−13 |
| | | | $c_3$ = 1.56339572303953E−17 |
| | | | $c_4$ = −1.41168321383233E−21 |
| | | | $c_5$ = 5.98677250336455E−25 |
| | | | $c_6$ = −6.30124060830317E−29 |
| 5th mirror 11 | −367.938526548613 | 325.746354374172 | $k_y$ = 1.07407597789597E−01 |
| | | | $c_1$ = 3.87917960004046E−11 |
| | | | $c_2$ = −3.43420257078373E−17 |
| | | | $c_3$ = 2.26996395088275E−21 |
| | | | $c_4$ = −2.71360350994977E−25 |
| | | | $c_5$ = 9.23791176750829E−30 |
| | | | $c_6$ = −1.37746833100643E−34 |
| Image plane 7 | infinity | | |

It can be discerned from FIG. 6 that maximum angles of incidence of 24° and interval lengths of 11° occur at different locations of the mirror 1. Consequently, the layer arrangement of the mirror 1 has to yield high and uniform reflectivity values at these different locations for different angles of incidence and different angle of incidence intervals, since otherwise a high total transmission and an acceptable pupil apodization of the projection objective 2 cannot be ensured.

The so-called PV value is used as a measure of the variation of the reflectivity of a mirror over the angles of incidence. In this case, the PV value is defined as the difference between the maximum reflectivity $R_{max}$ and the minimum reflectivity $R_{min}$ the angle of incidence interval under consideration divided by the average reflectivity $R_{average}$ in the angle of incidence interval under consideration. Consequently, PV=$(R_{max}-R_{min})/R_{average}$ holds true.

In this case, it should be taken into consideration that high PV values for a mirror 1 of the projection objective 2 as between the PV value of the mirror 1 and the imaging aberration of the pupil apodization of the projection objective 2 for high PV values of greater than 0.25 since, starting from this value, the PV value dominates the pupil apodization relative to other causes of aberration.

In FIG. 6, a bar 23 is used to mark by way of example a specific radius or a specific distance of the locations of the mirror 1 having the associated maximum angle of incidence of approximately 21° and the associated interval length of 11° with respect to the optical axis. Said marked radius corresponds in FIG. 7, described below, to the locations on the circle 23a—illustrated in dashed fashion—within the hatched region 20, which represents the optically used region 20 of the mirror 1.

Figure 7:
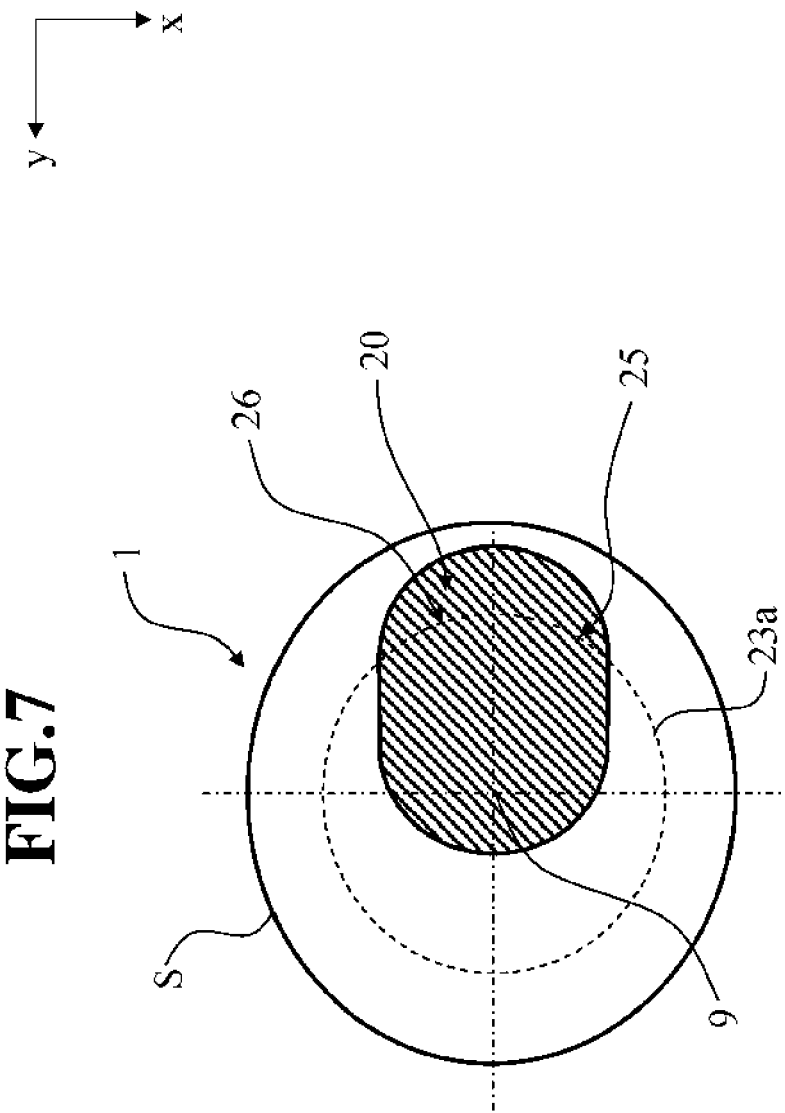
FIG. 7 shows a schematic illustration of the optically utilized region on the substrate of a mirror according to the invention.

FIG. 7 shows the substrate S of the penultimate mirror 1 in the light path from the object plane 5 to the image plane 7 of the projection objective 2 from FIG. 4 as a circle centered with respect to the optical axis 9 in plan view. In this case, the optical axis 9 of the projection objective 2 corresponds to the axis 9 of symmetry of the substrate. Furthermore, in FIG. 7, the optically used region 20 of the mirror 1, said region being offset with respect to the optical axis, is depicted in hatched fashion and a circle 23*a* is depicted in dashed fashion.

In this case, the part of the dashed circle 23*a* within the optically used region corresponds to the locations of the mirror 1 which are identified by the depicted bar 23 in FIG. 6. Consequently, the layer arrangement of the mirror 1 along the partial region of the dashed circle 23*a* within the optically used region 20, in accordance with the data from FIG. 6, has to ensure high reflectivity values both for a maximum angle of incidence of 21° and for a minimum angle of incidence of approximately 10°. In this case, the minimum angle of incidence of approximately 10° results from the maximum angle of incidence of 21° from FIG. 6 on account of the interval length of 11°. The locations on the dashed circle at which the two abovementioned extreme values of the angles of incidence occur are emphasized in FIG. 7 by the tip of the arrow 26 for the angle of incidence of 10° and by the tip of the arrow 25 for the angle of incidence of 21°.

Since a layer arrangement cannot be varied locally over the locations of a substrate S without high technological outlay and layer arrangements are generally applied rotationally symmetrically with respect to the axis 9 of symmetry of the substrate, the layer arrangement along the locations of the dashed circle 23*a* in FIG. 7 comprises one and the same layer arrangement such as is shown in its basic construction in FIGS. 1 to 3*a* and is explained in the form of specific exemplary embodiments with reference to FIGS. 8 to 15. In this case, it should be taken into consideration that a rotationally symmetrical coating of the substrate S with respect to the axis 9 of symmetry of the substrate S with the layer arrangement has the effect that the periodic sequence of the surface layer systems SPLS, P', P" and P'" of the layer arrangement is maintained at all locations of the mirror and only the thickness of the periods of the layer arrangement depending on the distance from the axis 9 of symmetry acquires a rotationally symmetrical profile over the substrate S, the layer arrangement being thinner at the edge of the substrate S than in the center of the substrate S at the axis 9 of symmetry.

It should be taken into consideration that it is possible, through a suitable coating technology, for example through use of distribution diaphragms, to adapt the rotationally symmetrical radial profile of the thickness of a coating over the substrate. Consequently, in addition to the design of the coating per se, with the radial profile of the so-called thickness factor of the coating design over the substrate, a further degree of freedom is available for optimizing the coating design.

The reflectivity values illustrated in FIGS. 8 to 15 were calculated using the complex refractive indices $\tilde{n}=n-i*k$ indicated in Table 2 for the used materials at the wavelength of 13.5 nm. In this case, it should be taken into consideration that reflectivity values of real mirrors can turn out to be lower than the theoretical reflectivity values illustrated in FIGS. 8 to 15, since in particular the refractive indices of real thin layers can deviate from the literature values mentioned in Table 2.

The refractive indices employed for the materials of the surface protecting layer SPL, $L_p$ and the surface protecting layer system SPLS and for graphene G, SPL, B are indicated in Table 2a.

TABLE 2

Employed refractive indices $\tilde{n} = n - i*k$ for 13.5 nm

| Material | Chemical symbol | Layer design symbol | n | k |
|---|---|---|---|---|
| Substrate | | | 0.973713 | 0.0129764 |
| Silicon | Si | H, H', H", H'" | 0.999362 | 0.00171609 |
| Boron carbide | $B_4C$ | B | 0.963773 | 0.0051462 |
| Molybdenum | Mo | L, L', L", L'" | 0.921252 | 0.0064143 |
| Ruthenium | Ru | M, L, L', L", L'" | 0.889034 | 0.0171107 |
| Vacuum | | | 1 | 0 |

TABLE 2a

Employed refractive indices $\tilde{n} = n - i*k$ for 13.5 nm for materials for the surface protecting layer SPL and the surface protecting layer system SPLS

| Material | Chemical symbol | Layer design symbol | n | k |
|---|---|---|---|---|
| Quartz | $SiO_2$ | SPL, $L_p$ | 0.9784 | 0.0107 |
| Nickel | Ni | SPL, $L_p$ | 0.9483 | 0.0727 |
| Cobalt | Co | SPL, $L_p$ | 0.9335 | 0.0660 |
| Silicon | Si | $H_p$ | 0.9994 | 0.0017 |
| Beryllium | Be | $H_p$ | 0.9888 | 0.0018 |
| Boron carbide | $B_4C$ | B | 0.9638 | 0.0051 |
| Carbon | C | B | 0.9617 | 0.0069 |
| Graphite | C | G, SPL, B | 0.9617 | 0.0069 |

Moreover, the following short notation in accordance with the layer sequence with respect to FIGS. 1, 2 and 3 is declared for the layer designs associated with FIGS. 8 to 15:
Substrate/ . . . /($P_1$)*$N_1$/($P_2$)*$N_2$/($P_3$)*$N_3$/covering layer system C
where
P1=H' B L' B; P2=H" B L" B; P3=H'" B L'" B; C=H B L M;
for FIGS. 2 and 3 and where
P1=B H'B L'; P2=B L"B H"; P3=H'"B L'"B; C=H B L M;
for FIG. 1 and for the fourth exemplary embodiment as a variant with respect to FIG. 3.

In this case, the letters H symbolically represent the thickness of high refractive index layers, the letters L represent the thickness of low refractive index layers, the letter B represents the thickness of the barrier layer and the letter M represents the thickness of the chemically inert terminating layer in accordance with Table 2 and the description concerning FIGS. 1, 2 and 3.

In this case, the unit [nm] applies to the thicknesses of the individual layers that are specified between the parentheses. The layer design used with respect to FIGS. 8 and 9 can thus be specified as follows in the short notation:
Substrate/ . . . /(0.4$B_4$C2.921Si0.4$B_4$C4.931Mo)*8/
(0.4$B_4$C4.145Mo0.4$B_4$C2.911Si)*5/
(3.509Si0.4$B_4$C3.216Mo0.4$B_4$C)*16/
2.975Si0.4$B_4$C2Mo1.5Ru Since the barrier layer $B_4C$ in this example is always 0.4 nm thick, it can also be omitted for illustrating the basic construction of the layer arrangement, such that the layer design with respect to FIGS. 8 and 9 can be specified in a manner shortened as follows:
Substrate/ . . . /(2.921Si4.931Mo)*8/(4.145Mo2.911Si)*5/
(3.509Si3.216Mo)*16/2.975Si2Mo1.5Ru It should be recognized from this first exemplary embodiment according to FIG. 1 that the order of the high refractive index layer Si and the low refractive index layer Mo in the second surface layer system, comprising five periods, has been reversed relative to the other surface layer systems, such that the first high refractive index layer of the surface layer system that is most distant from the substrate, with a thickness of 3.509 nm, directly succeeds the last high refractive index layer of the surface layer system that is second most distant from the substrate, with a thickness of 2.911 nm.

Figure 10:
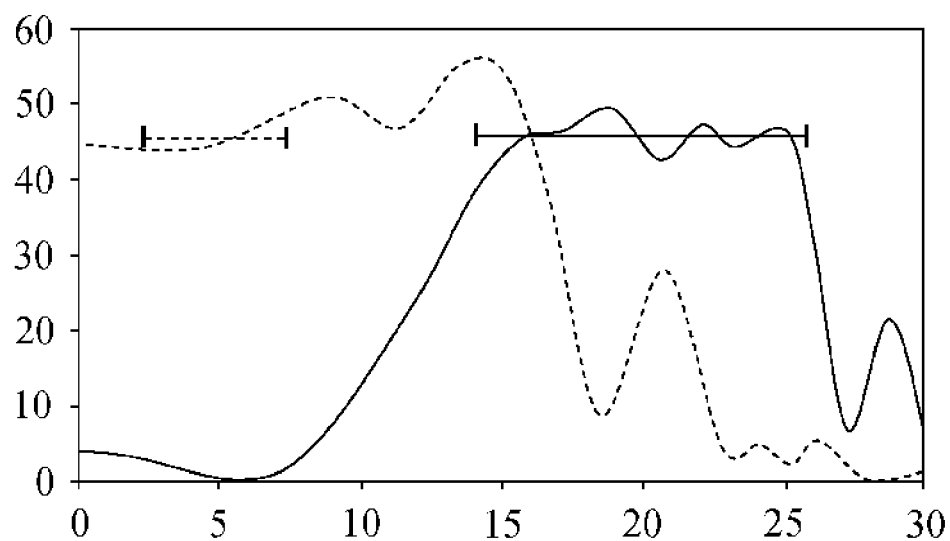
FIG. 10 shows a schematic illustration of some reflectivity values against the angles of incidence of the second mirror according to the invention from FIG. 2.
Figure 11:
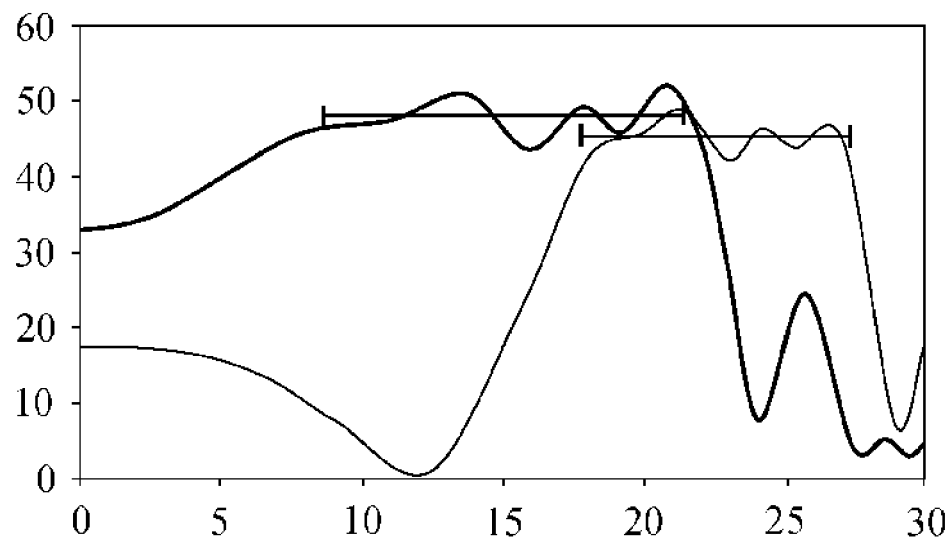
FIG. 11 shows a schematic illustration of further reflectivity values against the angles of incidence of the second mirror according to the invention from FIG. 2.

Correspondingly, it is possible to specify the layer design used with respect to FIGS. 10 and 11 as second exemplary embodiment in accordance with FIG. 2 in the short notation as:
Substrate/ . . . /(4.737Si0.4B$_4$C2.342Mo0.4B$_4$C)*28/
(3.443Si0.4B$_4$C2.153Mo0.4B$_4$C)*5/
(3.523Si0.4B$_4$C3.193Mo0.4B$_4$C)*15/
2.918Si0.4B$_4$C2Mo1.5Ru Since the barrier layer B$_4$C in this example is in turn always 0.4 nm thick, it can also be omitted for illustrating this layer arrangement, such that the layer design with respect to FIGS. 10 and 11 can be specified in a manner shortened as follows:
Substrate/ . . . /(4.737Si2.342Mo)*28/(3.443Si2.153Mo)*5/
(3.523Si3.193Mo)*15/2.918Si2Mo1.5Ru Accordingly, it is possible to specify the layer design used with respect to FIGS. 12 and 13 as third exemplary embodiment in accordance with FIG. 3 in the short notation as:
Substrate/ . . . /(1.678Si0.4B$_4$C5.665Mo0.4B$_4$C)*27/
(3.798Si0.4B$_4$C2.855Mo0.4B$_4$C)*14/
1.499Si0.4B$_4$C2Mo1.5Ru
and, disregarding the barrier layer B$_4$C for illustration purposes, as:
Substrate/ . . . /(1.678Si5.665Mo)*27/(3.798Si2.855Mo)*14/1.499Si2Mo1.5Ru Likewise, it is possible to specify the layer design used with respect to FIGS. 14 and 15 as fourth exemplary embodiment in accordance with a variant with respect to FIG. 3 in the short notation as:
Substrate/ . . . /(0.4B$_4$C4.132Mo0.4B$_4$C2.78Si)*6/
(3.608Si0.4B$_4$C3.142Mo0.4B$_4$C)*16/
2.027Si0.4B$_4$C2Mo1.5Ru
and, disregarding the barrier layer B$_4$C for illustration purposes, as:
Substrate/ . . . /(4.132Mo2.78Si)*6/(3.609Si3.142Mo)*16/
2.027Si2Mo1.5Ru It should be recognized from this fourth exemplary embodiment that the order of the high refractive index layer Si and the low refractive index layer Mo in the surface layer system P''', comprising six periods, has been reversed relative to the other surface layer system P'''' having 16 periods, such that the first high refractive index layer of the surface layer system P'''' that is most distant from the substrate, with a thickness of 3.609 nm, directly succeeds the last high refractive index layer of the surface layer system P''' that is second most distant from the substrate, with a thickness of 2.78 nm.

This fourth exemplary embodiment is therefore a variant of the third exemplary embodiment in which the order of the high and low refractive index layers in the surface layer system P''' that is second most distant from the substrate has been reversed according to the first exemplary embodiment with respect to FIG. 1.

Figure 8:
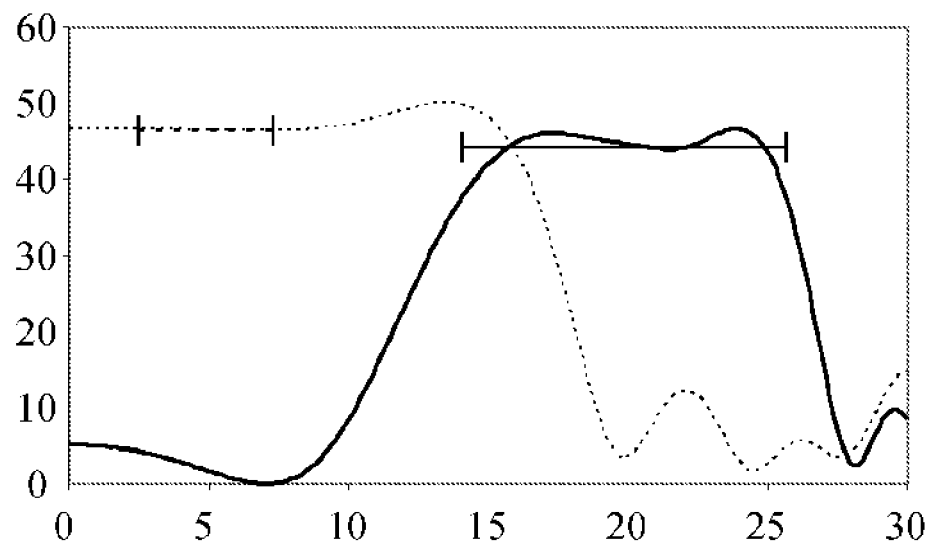
FIG. 8 shows a schematic illustration of some reflectivity values against the angles of incidence of the first mirror according to the invention from FIG. 1.
Figure 9:
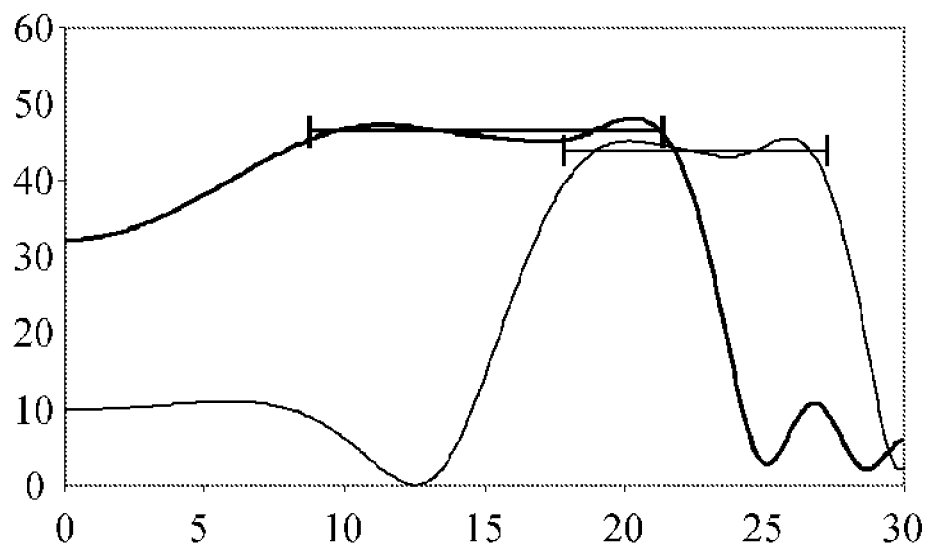
FIG. 9 shows a schematic illustration of further reflectivity values against the angles of incidence of the first mirror according to the invention from FIG. 1.

The layer designs specified above can also be provided with a surface protecting layer SPL or a surface protecting layer system SPLS, such that it is possible e.g. to specify the first layer design with respect to FIGS. 8 to 9 with a 2 μm thick quartz layer and a layer composed of graphene G in accordance with FIG. 1a as:

Substrate/2000SiO$_2$/G(0.4B$_4$C2.921Si0.4B$_4$C4.931Mo)*8/
(0.4B$_4$C4.145Mo0.4B$_4$C2.911Si)*5/
(3.509Si0.4B$_4$C3.216Mo0.4B$_4$C)*16/
2.975Si0.4B$_4$C2Mo1.5Ru Correspondingly, it is possible to specify this layer design with a 100 nm thick nickel layer as surface protecting layer SPL and a layer composed of graphene G in accordance with FIG. 1a as:
Substrate/100Ni/G(0.4B$_4$C2.921Si0.4B$_4$C4.931Mo)*8/
(0.4B$_4$C4.145Mo0.4B$_4$C2.911Si)*5/
(3.509Si0.4B$_4$C3.216Mo0.4B$_4$C)*16/
2.975Si0.4B$_4$C2Mo1.5Ru As an alternative, it is possible to specify this layer design with a surface protecting layer system SPLS consisting of 20 periods of 5 nm thick nickel layers which are separated by layers composed of graphene G, B, in accordance with FIG. 3a as:
Substrate/(5NiG)*20/(0.4B$_4$C2.921Si0.4B$_4$C4.931Mo)*8/
(0.4B$_4$C4.145Mo0.4B$_4$C2.911Si)*5/
(3.509Si0.4B$_4$C3.216Mo0.4B$_4$C)*16/
2.975Si0.4B$_4$C2Mo1.5Ru In this case, it should be taken into consideration that individual surface protecting layers SPL composed of quartz or nickel have only a small influence on the reflectivity curves of the layer designs with respect to FIGS. 8 to 15. The alteration of the reflectivity values is approximately 1% in this case. Layers composed of graphene which consist only of a few monolayers can in this case be disregarded in terms of their influence on the reflectivity curves. However, layers composed of graphene should be taken into account in the layer design starting from a thickness corresponding to 4 monolayers of graphene with the optical constants of thin graphite layers.

A surface protecting layer system SPLS composed of 20 periods of 5 nm thick nickel layers which are separated by layers composed of graphene has the effect that the reflectivity curves of the layer designs with respect to FIGS. 8 to 15 shift by approximately an angle of incidence of 2°, such that a subsequent optimization of the layer design becomes necessary in this case given a fixedly predetermined angle of incidence interval. After such an optimization has been carried out, the alteration of the reflectivity values of these layer designs with the surface protecting layer system SPLS by comparison with the layer designs with respect to FIGS. 8 to 15 is approximately 2%. In this case, too, relatively thick layers composed of graphene can no longer be disregarded in the optimization.

FIG. 8 shows reflectivity values for unpolarized radiation in the unit [%] of the first exemplary embodiment of a mirror 1a according to the invention in accordance with FIG. 1 plotted against the angle of incidence in the unit [°]. In this case, the first surface layer system P' of the layer arrangement of the mirror 1a consists of N$_1$=8 periods P$_1$, wherein the period P$_1$ consists of 2.921 nm Si as high refractive index layer and 4.931 nm Mo as low refractive index layer, and also of two barrier layers each comprising 0.4 nm B$_4$C. The period P$_1$ consequently has a thickness d$_1$ of 8.652 nm. The second surface layer system P''' of the layer arrangement of the mirror 1a having the reversed order of the layers Mo and Si consists of N$_2$=5 periods P$_2$, wherein the period P$_2$ consists of 2.911 nm Si as high refractive index layer and 4.145 nm Mo as low refractive index layer, and also of two barrier layers each comprising 0.4 nm B$_4$C. The period P$_2$ consequently has a thickness d$_2$ of 7.856 nm. The third surface layer system P'''' of the layer arrangement of the mirror 1a consists of N$_3$=16 periods P$_3$, wherein the period P$_3$ consists of 3.509 nm Si as high refractive index layer and 3.216 nm Mo as low refractive index layer, and also of two barrier layers each comprising 0.4 nm $B_4C$. The period $P_3$ consequently has a thickness $d_3$ of 7.525 nm. The layer arrangement of the mirror 1a is terminated by a covering layer system C consisting of 2.975 nm Si, 0.4 nm $B_4C$, 2 nm Mo and 1.5 nm Ru in the order specified. Consequently, the surface layer system P''' that is most distant from the substrate has a number $N_3$ of periods $P_3$ that is greater than the number $N_2$ of periods $P_2$ for the surface layer system P'' that is second most distant from the substrate and the first high refractive index layer H''' of the surface layer system P''' that is most distant from the substrate directly succeeds the last high refractive index layer H'' of the surface layer system P'' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 8. Moreover, the average reflectivity of this nominal layer design for the angle of incidence interval of 14.1° to 25.7° is depicted as a solid horizontal bar. Furthermore, FIG. 8 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 8 amount to only 93.3% of the corresponding thicknesses of the periods of the nominal layer design. In other words, the layer arrangement is thinner than the nominal layer design by 6.7% at the mirror surface of the mirror 1a at the locations at which angles of incidence of between 2.5° and 7.3° have to be ensured.

FIG. 9 shows, at a wavelength of 13.5 nm and given a thickness factor of 1.018, in a manner corresponding to FIG. 8, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of the mirror 1a at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 8 and FIG. 9 are compiled relative to the angle of incidence intervals and the thickness factors in Table 3. It can be discerned that the mirror 1a comprising the layer arrangement specified above, at a wavelength of 13.5 nm for angles of incidence of between 2.5° and 27.2°, has an average reflectivity of more than 43% and a variation of the reflectivity as PV value of less than or equal to 0.21.

TABLE 3

Average reflectivity and PV values of the layer design with respect to FIG. 8 and FIG. 9 relative to the angle of incidence interval in degrees and the thickness factor chosen.

| AOI Interval [°] | Thickness factor | R_average [%] | PV |
|---|---|---|---|
| 17.8-27.2 | 1.018 | 43.9 | 0.14 |
| 14.1-25.7 | 1 | 44.3 | 0.21 |
| 8.7-21.4 | 0.972 | 46.4 | 0.07 |
| 2.5-7.3 | 0.933 | 46.5 | 0.01 |

FIG. 10 shows reflectivity values for unpolarized radiation in the unit [%] of the second exemplary embodiment of a mirror 1b according to the invention in accordance with FIG. 2 plotted against the angle of incidence in the unit [°]. In this case, the first surface layer system P' of the layer arrangement of the mirror 1b consists of $N_1=28$ periods $P_1$, wherein the period $P_1$ consists of 4.737 nm Si as high refractive index layer and 2.342 nm Mo as low refractive index layer, and also of two barrier layers each comprising 0.4 nm $B_4C$. The period $P_1$ consequently has a thickness $d_1$ of 7.879 nm. The second surface layer system P'' of the layer arrangement of the mirror 1b consists of $N_2=5$ periods $P_2$, wherein the period $P_2$ consists of 3.443 nm Si as high refractive index layer and 2.153 nm Mo as low refractive index layer, and also of two barrier layers each comprising 0.4 nm $B_4C$. The period $P_2$ consequently has a thickness $d_2$ of 6.396 nm. The third surface layer system P''' of the layer arrangement of the mirror 1b consists of $N_3=15$ periods $P_3$, wherein the period $P_3$ consists of 3.523 nm Si as high refractive index layer and 3.193 nm Mo as low refractive index layer, and also of two barrier layers each comprising 0.4 nm $B_4C$. The period $P_3$ consequently has a thickness $d_3$ of 7.516 nm. The layer arrangement of the mirror 1b is terminated by a covering layer system C consisting of 2.918 nm Si, 0.4 nm $B_4C$, 2 nm Mo and 1.5 nm Ru in the order specified. Consequently, the surface layer system P''' that is most distant from the substrate has a number $N_3$ of periods $P_3$ that is greater than the number $N_2$ of periods $P_2$ for the surface layer system P'' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 10. Moreover, the average reflectivity of this nominal layer design for the angle of incidence interval of 14.1° to 25.7° is depicted as a solid horizontal bar. Furthermore, FIG. 10 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 10 amount to only 93.3% of the corresponding thicknesses of the periods of the nominal layer design. In other words, the layer arrangement is thinner than the nominal layer design by 6.7% at the mirror surface of the mirror 1b at the locations at which angles of incidence of between 2.5° and 7.3° have to be ensured.

FIG. 11 shows, at a wavelength of 13.5 nm and given a thickness factor of 1.018, in a manner corresponding to FIG. 10, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of the mirror 1b at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 10 and FIG. 11 are compiled relative to the angle of incidence intervals and the thickness factors in Table 4. It can be discerned that the mirror 1b comprising the layer arrangement specified above, at a wavelength of 13.5 nm for angles of incidence of between 2.5° and 27.2°, has an average reflectivity of more than 45% and a variation of the reflectivity as PV value of less than or equal to 0.23.

TABLE 4

Average reflectivity and PV values of the layer design with respect to FIG. 10 and FIG. 11 relative to the angle of incidence interval in degrees and the thickness factor chosen.

| AOI Interval [°] | Thickness factor | R_average [%] | PV |
|---|---|---|---|
| 17.8-27.2 | 1.018 | 45.2 | 0.17 |
| 14.1-25.7 | 1 | 45.7 | 0.23 |
| 8.7-21.4 | 0.972 | 47.8 | 0.18 |
| 2.5-7.3 | 0.933 | 45.5 | 0.11 |

Figure 12:
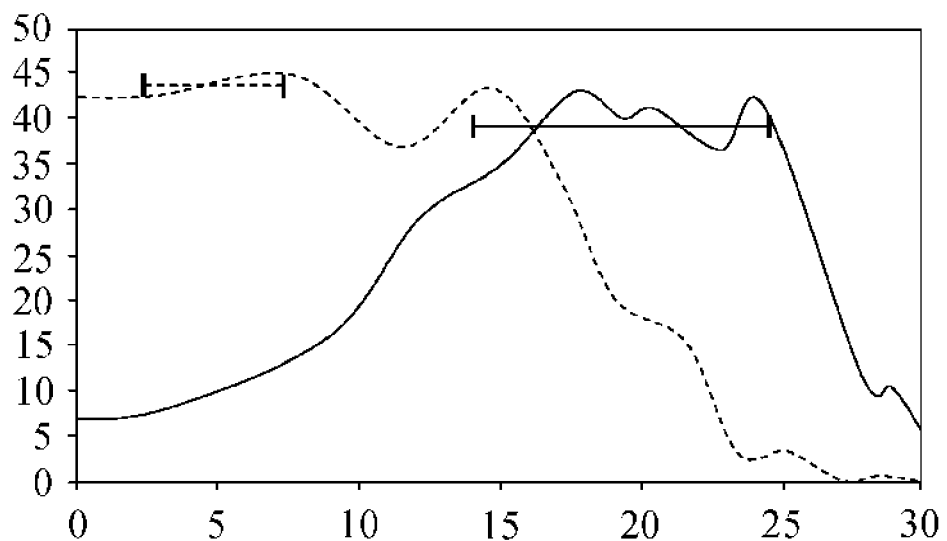
FIG. 12 shows a schematic illustration of some reflectivity values against the angles of incidence of the third mirror according to the invention from FIG. 3.

FIG. 12 shows reflectivity values for unpolarized radiation in the unit [%] of the third exemplary embodiment of a mirror 1c according to the invention in accordance with FIG. 3 plotted against the angle of incidence in the unit [°]. In this case, the surface layer system P'' of the layer arrangement of the mirror 1c consists of $N_2=27$ periods $P_2$, wherein the period $P_2$ consists of 1.678 nm Si as high refractive index layer and 5.665 nm Mo as low refractive index layer, and also of two barrier layers each comprising 0.4 nm $B_4C$. The period $P_2$ consequently has a thickness $d_2$ of 8.143 nm. The surface layer system P''' of the layer arrangement of the mirror 1c consists of $N_3=14$ periods $P_3$, wherein the period $P_3$ consists of 3.798 nm Si as high refractive index layer and 2.855 nm Mo as low refractive index layer, and also of two barrier layers each comprising 0.4 nm $B_4C$. Consequently, the period $P_3$ has a thickness $d_3$ of 7.453 nm. The layer arrangement of the mirror 1c is terminated by a covering layer system C consisting of 1.499 nm Si, 0.4 nm $B_4C$, 2 nm Mo and 1.5 nm Ru in the order specified. Consequently, the surface layer system P''' that is most distant from the substrate has a thickness of the high refractive index layer H''' that amounts to more than double the thickness of the high refractive index layer H'' of the surface layer system P''' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 12. Moreover, the average reflectivity of this nominal layer design for the angle of incidence interval of 14.1° to 25.7° is depicted as a solid horizontal bar. Furthermore, FIG. 12 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 12 amount to only 93.3% of the corresponding thicknesses of the periods of the nominal layer design. In other words, the layer arrangement is thinner than the nominal layer design by 6.7% at the mirror surface of the mirror 1c at the locations at which angles of incidence of between 2.5° and 7.3° have to be ensured.

Figure 13:
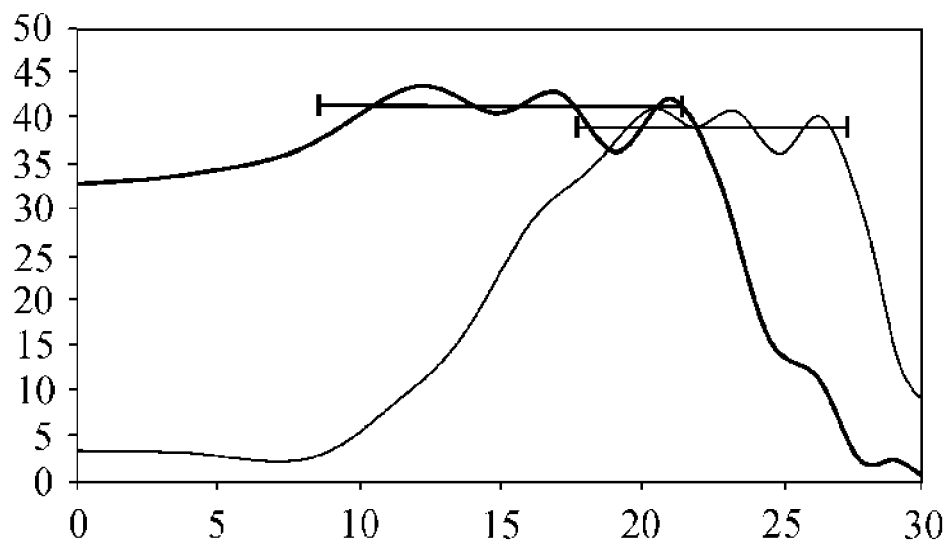
FIG. 13 shows a schematic illustration of further reflectivity values against the angles of incidence of the third mirror according to the invention from FIG. 3.

FIG. 13 shows in a manner corresponding to FIG. 12, at a wavelength of 13.5 nm and given a thickness factor of 1.018, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of the mirror 1c at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 12 and FIG. 13 are compiled relative to the angle of incidence intervals and the thickness factors in Table 5. It can be discerned that the mirror 1c comprising the layer arrangement specified above, at a wavelength of 13.5 nm for angles of incidence of between 2.5° and 27.2°, has an average reflectivity of more than 39% and a variation of the reflectivity as PV value of less than or equal to 0.22.

TABLE 5

Average reflectivity and PV values of the layer design with respect to FIG. 12 and FIG. 13 relative to the angle of incidence interval in degrees and the thickness factor chosen.

| AOI Interval [°] | Thickness factor | R_average [%] | PV |
|---|---|---|---|
| 17.8-27.2 | 1.018 | 39.2 | 0.19 |
| 14.1-25.7 | 1 | 39.5 | 0.22 |
| 8.7-21.4 | 0.972 | 41.4 | 0.17 |
| 2.5-7.3 | 0.933 | 43.9 | 0.04 |

Figure 14:
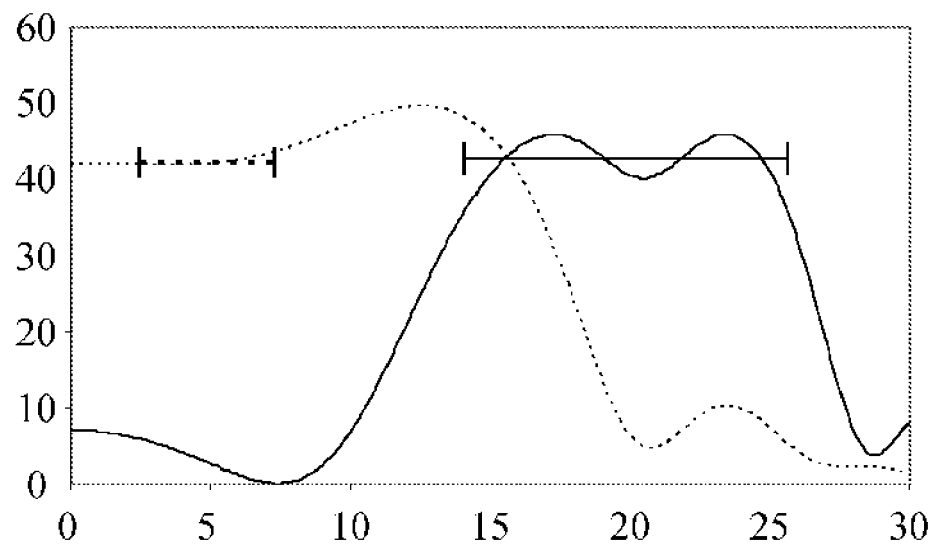
FIG. 14 shows a schematic illustration of some reflectivity values against the angles of incidence of a fourth mirror according to the invention.

FIG. 14 shows reflectivity values for unpolarized radiation in the unit [%] of the fourth exemplary embodiment of a mirror according to the invention as a variant of the mirror 1c in which the order of the layers in the surface layer system P'' has been reversed, plotted against the angle of incidence in the unit [°]. In this case, the surface layer system P'' of the layer arrangement of the mirror consists of $N_2=6$ periods $P_2$, wherein the period $P_2$ consists of 2.78 nm Si as high refractive index layer and 4.132 nm Mo as low refractive index layer, and also of two barrier layers each comprising 0.4 nm $B_4C$. The period $P_2$ consequently has a thickness $d_2$ of 7.712 nm. The surface layer system P''' of the layer arrangement of the mirror consists of $N_3=16$ periods $P_3$, wherein the period $P_2$ consists of 3.608 nm Si as high refractive index layer and 3.142 nm Mo as low refractive index layer, and also of two barrier layers each comprising 0.4 nm B$_4$C. The period P$_3$ consequently has a thickness d$_3$ of 7.55 nm. The layer arrangement of the mirror is terminated by a covering layer system C consisting of 2.027 nm Si, 0.4 nm B$_4$C, 2 nm Mo and 1.5 nm Ru in the order specified. Consequently, the surface layer system P' that is most distant from the substrate has a thickness of the high refractive index layer H''' which amounts to more than 120% of the thickness of the high refractive index layer H'' of the surface layer system P'' that is second most distant from the substrate. Furthermore, the surface layer system P''' that is most distant from the substrate has a number N$_3$ of periods P$_3$ that is greater than the number N$_2$ of periods P$_2$ for the surface layer system P'' that is second most distant from the substrate, and the first high refractive index layer H''' of the surface layer system P' that is most distant from the substrate directly succeeds the last high refractive index layer H'' of the surface layer system P'' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 14. Moreover, the average reflectivity of this nominal layer design for the angle of incidence interval of 14.1° to 25.7° is depicted as a solid horizontal bar. Furthermore, FIG. 14 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 14 amount to only 93.3% of the corresponding thicknesses of the periods of the nominal layer design. In other words, the layer arrangement is thinner than the nominal layer design by 6.7% at the mirror surface of the mirror according to the invention at the locations at which angles of incidence of between 2.5° and 7.3° have to be ensured.

Figure 15:
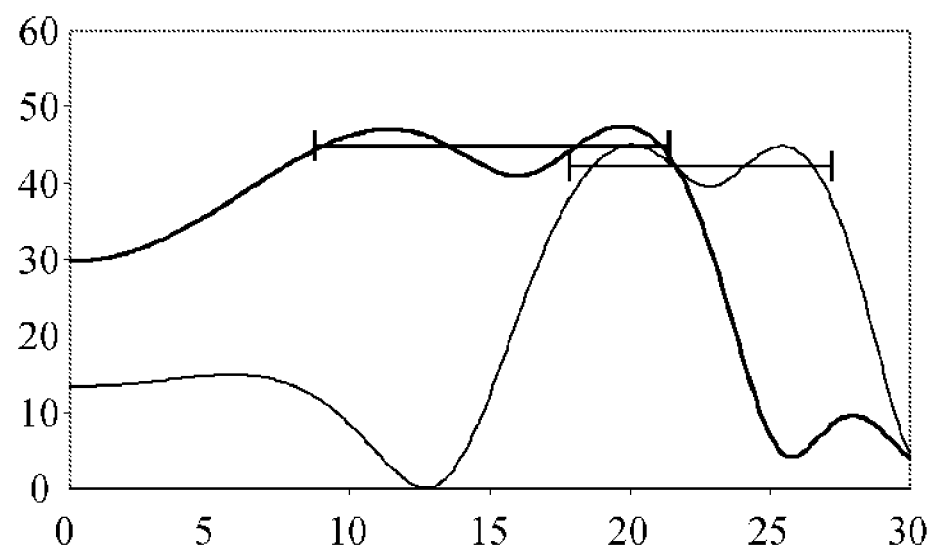
FIG. 15 shows a schematic illustration of further reflectivity values against the angles of incidence of the fourth mirror according to the invention.

FIG. 15 shows, at a wavelength of 13.5 nm and given a thickness factor of 1.018, in a manner corresponding to FIG. 14, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of this mirror according to the invention at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 14 and FIG. 15 are compiled relative to the angle of incidence intervals and the thickness factors in Table 6. It can be discerned that the mirror according to the invention comprising the layer arrangement specified above, at a wavelength of 13.5 nm for angles of incidence of between 2.5° and 27.2°, has an average reflectivity of more than 42% and a variation of the reflectivity as PV value of less than or equal to 0.24.

TABLE 6

Average reflectivity and PV values of the layer design with respect to FIG. 14 and FIG. 15 relative to the angle of incidence interval in degrees and the thickness factor chosen.

| AOI Interval [°] | Thickness factor | R_average [%] | PV |
|---|---|---|---|
| 17.8-27.2 | 1.018 | 42.4 | 0.18 |
| 14.1-25.7 | 1 | 42.8 | 0.24 |
| 8.7-21.4 | 0.972 | 44.9 | 0.15 |
| 2.5-7.3 | 0.933 | 42.3 | 0.04 |

In all four exemplary embodiments shown, the number of periods of the surface layer system that is respectively situated closest to the substrate can be increased in such a way that the transmission of EUV radiation through the surface layer systems is less than 10%, in particular less than 2%, particularly preferably less than 0.2%.

Firstly, it is thus possible, as already mentioned in the introduction, to avoid perturbing effects of the layers lying below the layer arrangement or of the substrate on the optical properties of the mirror, and in this case in particular on the reflectivity, and, secondly, it is thereby possible for layers lying below the layer arrangement or the substrate to be sufficiently protected from the EUV radiation.

Figure 16:
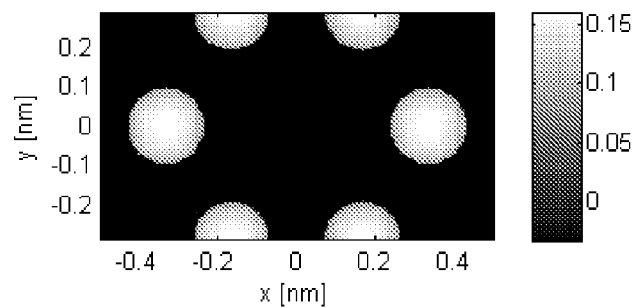
FIG. 16 shows a schematic illustration of the surface profile of a unit cell of a monolayer composed of graphene.

FIG. 16 shows a schematic illustration of the surface profile $z_{(x,y)}$ of a unit cell of a monolayer composed of graphene. In this case, an ideal flat plane was assumed as a model of said monolayer, on which plane the carbon atoms of the graphene are situated as solid spheres in a hexagonal arrangement. The diameter of a sphere is 0.192 nm in this case, and the sphere centres of two adjacent spheres are respectively situated at a distance of 0.334 nm from one another. The surface profile of graphene which results from this model is illustrated in FIG. 16 as a grey scale over an area of approximately 0.6 nm$^2$. On account of this surface profile, this results in a theoretical surface roughness of $R_q$=0.065 nm rms and of $R_a$=0.052 nm with the height deviation z$_i$ of a point of the surface profile relative to the ideal flat plane in accordance with:

$$R_q = \sqrt{\frac{1}{N}\sum_{i=1}^{N} z_i^2} \text{ and } R_a = \frac{1}{N}\sum_{i=1}^{N} |z_i|.$$

However, such a theoretical roughness of graphene can be determined experimentally only with a measuring device with a spatial resolution in the subnanometers range. By contrast, the present-day AFM microscopes used for determining the roughness in the HSFR frequency range average over an area having a diameter of approximately 20 nm. Therefore, in the case of measurements using such an AFM microscope, the roughness of a monolayer of graphene is exactly 0 nm HSFR or an HSFR value within the measurement accuracy of the AFM microscope, since the microscope perceives only an averaged smooth area of the graphene and cannot detect the frequency range above the HSFR range on account of the lack of spatial resolution. Therefore, a monolayer composed of graphene has a roughness measured by AFM of 0 nm rms HSFR and a theoretical roughness of 0.065 nm rms above the HSFR range. The statements made with reference to FIG. 16 concerning the surface roughness of a monolayer composed of graphene are correspondingly applicable to the topmost layer of a graphene layer consisting of multilayers. For the subdivision of surface roughnesses according to spatial frequency ranges with the high spatial frequency range (HSFR range) having spatial wavelengths of the roughness of 10 nm to 1 μm, the medium spatial frequency range (MSFR range) having spatial wavelengths of the roughness of 1 μm to 1 mm, and the figure range (surface form defect or alternatively called figure) having spatial wavelengths of 1 mm to the free optical diameter, reference is made to U. Dinger et al. "Mirror substrates for EUV-lithography: progress in metrology and optical fabrication technology" in Proc. SPIE Vol. 4146, 2000.

Figure 17:
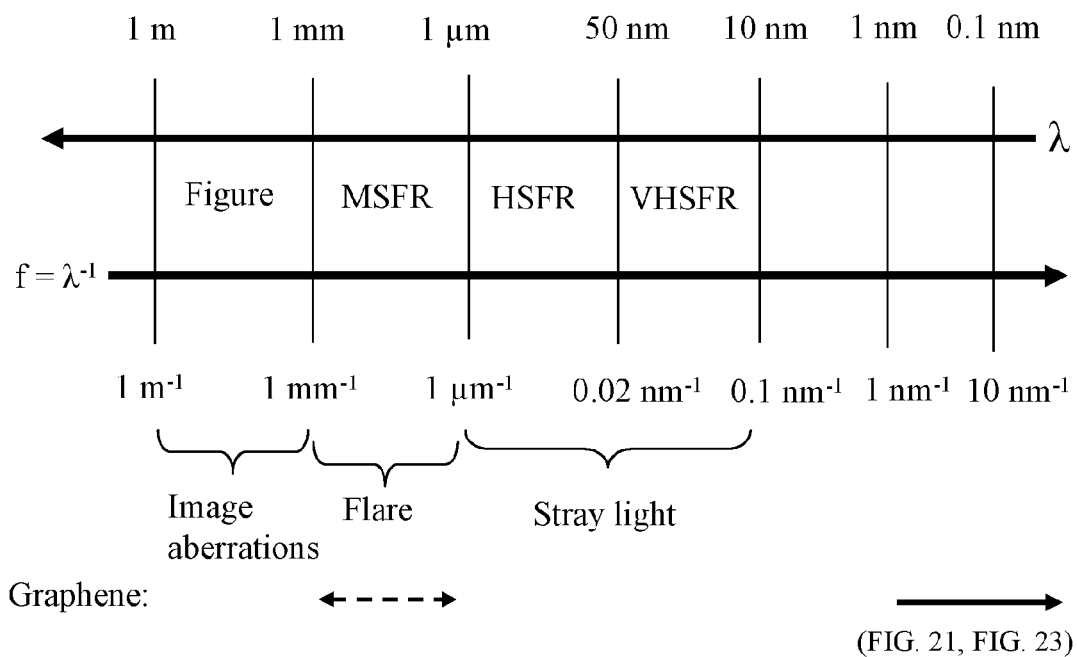
FIG. 17 shows an overview of the classification of surface aberrations according to the spatial wavelength or spatial frequency in accordance with figure/MSFR/HSFR and VHSFR.

Furthermore, for clarification purposes, FIG. 17 illustrates the spatial frequency ranges figure, MSFR, HSFR and very HSFR (VHSFR) on the basis of the associated spatial wavelengths X and on the basis of the associated spatial frequencies f=1/λ. By comparison with the above-cited publication by U. Dinger et al., the HSFR range in the meantime is subdivided into the HSFR range having spatial wavelengths of 50 nm to 1 μm or spatial frequencies of 1 μm$^{-1}$ to 0.02 nm$^{-1}$ and the very HSFR range (VHSFR) having spatial wavelengths of 10 nm to 50 nm or spatial frequencies of from 0.02 nm$^{-1}$ to 0.1 nm$^{-1}$.

The deviation of a real area from the ideal design area of an optical element, in the spatial wavelength range of 1 mm to the diameter of the optical element, is designated as surface form defect or as figure defect. These deviations are produced during the form processing of the optical element by form processing machines and lead to imaging aberrations of the optical system such as astigmatism, coma, distortion and the like. Such deviations of a real optical element from the ideal surface form can be measured using an interferometer over the entire surface of the optical element and can be reduced by form correction processes such as ion beam processing, for example. In this case, the specifications for EUV mirrors are approximately 0.1 nm rms surface form defect.

The deviation of a real area from the ideal design area of an optical element in the MSFR range leads to a point pattern widening. In customary usage this is referred to as flare. Through an optical system comprising optical elements having high roughness values in the MSFR range, specified in the unit nm rms MSFR, a halo arises around the point pattern of a bright point to be imaged, which halo widens the point pattern and thus reduces the contrast of the imaging. References in the MSFR range usually arise as a result of damage to the surface during form processing by diamond cutting, for example. These roughnesses are measured using microscope interferometers on an area of 0.25 mm×0.25 mm of the optical element and can be reduced by polishing the surface or through ion beam processing. In this case, the specifications for EUV mirrors are approximately 0.1 nm rms MSFR.

The deviation of a real area from the ideal design area of an optical element in the HSFR range, by contrast, leads to stray light losses since light is diffracted by the high-frequency HSFR structures. These roughnesses in the HSFR range are measured using AFM microscopes on an area of 10 μm×10 μm with a spatial resolution of 0.3-3 μm or on an area of 1 μm×1 μm with a spatial resolution of 10-300 nm of the optical element and can be reduced by so-called superpolishing methods. In this case, the specifications for EUV mirrors are approximately 0.1 nm rms HSFR.

A monolayer composed of graphene which extends at least over an area of approximately 0.5 μm×0.5 μm of an optical element has, as already discussed with reference to FIG. 16, a surface roughness of 0 nm rms HSFR in the HSFR range and also in the VHSFR range. It is only in the spatial frequency range above VHSFR with spatial wavelengths of below 1 nm that a monolayer composed of graphene actually has a roughness. This spatial frequency range is identified in FIG. 17 with the aid of the solid arrow for graphene and will be discussed in greater detail with reference to FIGS. 21 and 23. Such a monolayer composed of graphene thus avoids stray light losses since the structural distances of graphene are too small to diffract light having the EUV wavelength.

The deposition of graphene layers onto polished nickel, silicon or silicon oxide is known from WO 2009/129194 A2, which in the entire scope becomes part of the present disclosure by reference (incorporation by reference). In WO 2009/129194 A2, the graphene is deposited in mono-, bi- or multilayers over a large area region, wherein the monocrystalline states, i.e. states with pure mono-, bi- or multilayers, extend over areas of approximately 0.5 μm×0.5 μm, see for example the discussion concerning FIG. 15 and FIG. 31 in WO 2009/129194.

Such homogeneous layers composed of graphene make it possible to reduce the roughness in the HSFR range to 0 nm rms HSFR and to minimize the stray light losses at mirrors comprising such graphene layers. In this case, the graphene layers can indeed have regions having a different number of graphene layers along the mirror surface. Although the transitions of these regions contribute to the roughness in the MSFR range, as is illustrated in FIG. 17 with the aid of the interrupted double-headed arrow for graphene, it is possible to correct MSFR roughnesses, particularly in the case of a layer deposited on the graphene layer, using polishing methods, such as ion beam processing, for example. In this respect, the use of graphene layers for the mirrors 1a, 1a', 1b, 1b', 1c and 1c' according to the invention makes it possible to reduce the roughness of at least said graphene layers to less than 0.1 nm rms HSFR, in particular less than 0.04 nm rms HSFR. Furthermore, the theoretical roughness of graphene layers of $R_q$=0.065 nm rms above HSFR contributes to the fact that other layers growing on the graphene layers grow, on account of a lack of imperfections, in such a way that their surface likewise has lower roughness values in the HSFR range.

Figure 18:
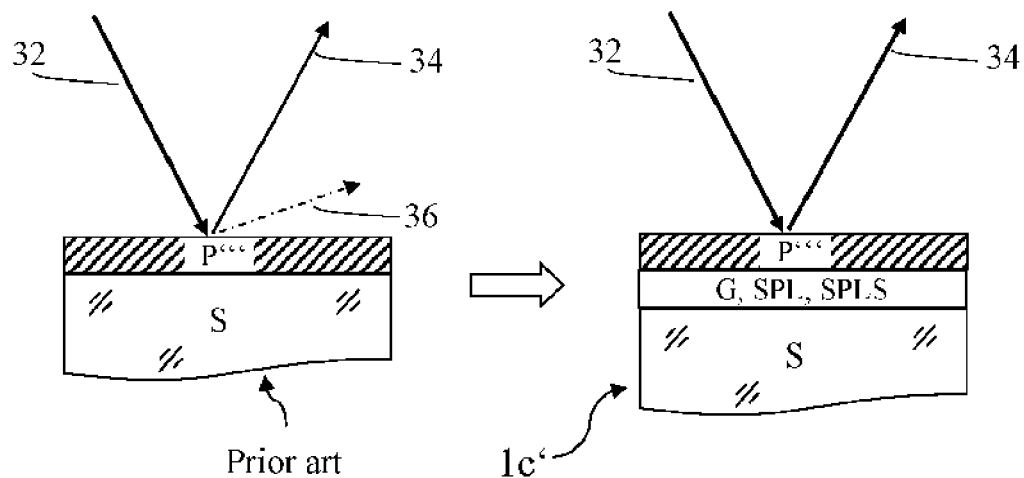
FIG. 18 shows a schematic illustration of the reflection of a mirror from the prior art without a layer composed of graphene and of a mirror according to the invention with a layer composed of graphene.

FIG. 18 shows, in the left-hand illustration, a mirror from the prior art comprising a substrate S and a layer arrangement, wherein the layer arrangement is designed in such a way that light 32 having a wavelength of less than 250 nm which is incident on the mirror at at least an angle of incidence of between 0° and 30° is reflected with more than 20% of its intensity, illustrated as reflected arrow 34, and the layer arrangement comprises at least one surface layer system P''' which consists of a periodic sequence of at least two periods $P_3$ of individual layers, and wherein the periods $P_3$ comprise two individual layers composed of different materials for a high refractive index layer H''' and a low refractive index layer L'''. The surface roughness of the substrate or of the layers of such a mirror from the prior art leads to stray light, which is illustrated with the aid of the arrow 36 in FIG. 18. By contrast, the at least one graphene layer of a mirror 1a, 1a', 1b, 1b', 1c and 1c', according to the invention, such as is illustrated schematically in a simplified manner in the right-hand illustration in FIG. 18, leads to a reduction of the stray light proportion on account of the "frequency hole" in the HSFR range of the at least one graphene layer, as is illustrated in FIG. 17. In this case, the use of the graphene layer for reducing stray light in mirrors is not restricted to the EUV wavelength range. Such a graphene layer is also suitable for other mirrors such as are used in projection exposure apparatuses for microlithography at wavelengths of less than 250 nm. The graphene layer G, SPL and B, in the case of the mirror 1a, 1a', 1b, 1b', 1c and 1c' according to the invention in FIG. 18, can be formed as a graphene layer G, as a surface protecting layer SPL or as a barrier layer B within the surface protecting layer system SPLS or within the other surface layer systems of the layer arrangement.

Figure 19:
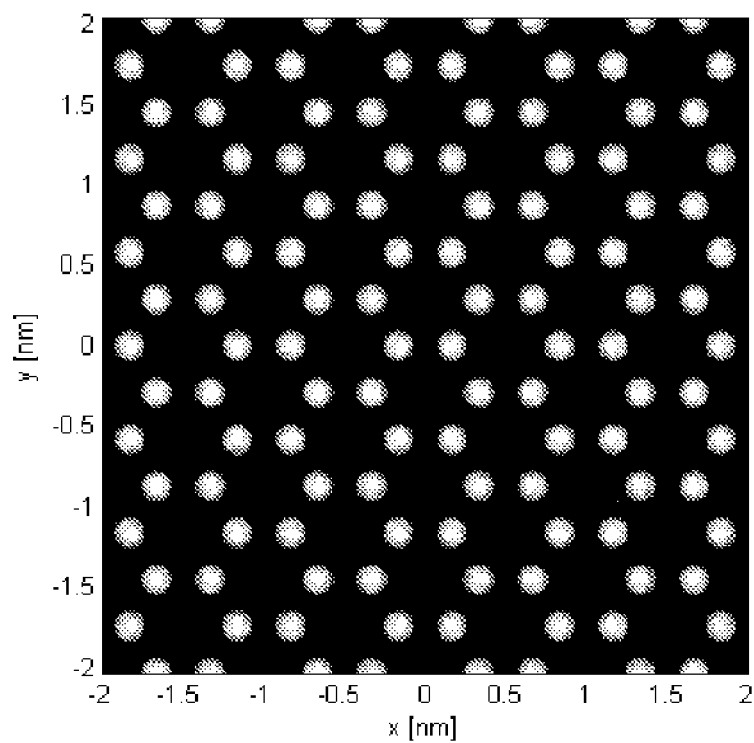
FIG. 19 shows a schematic illustration of the surface profile of a plurality of unit cells of a monolayer composed of graphene.

FIG. 19 shows a schematic illustration of the surface profile of a plurality of unit cells—illustrated in FIG. 16—of a monolayer composed of graphene. In this case, in a manner corresponding to FIG. 16, the same amplitude scale in the unit nm for the amplitude of the innovation relative to the ideal plane applies to FIG. 19. The square of the absolute value of the Fourier spectrum of the surface profile of FIG. 19, which is obtained through discrete Fourier transformation, is illustrated in FIG. 20.

Figure 20:
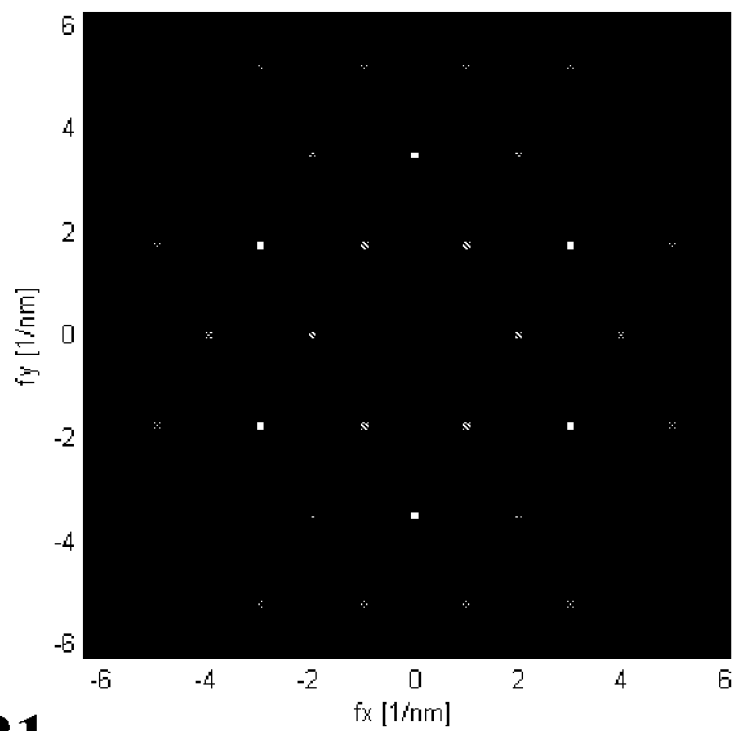
FIG. 20 shows a schematic illustration of the area-normalized two-dimensional PSD function of a monolayer composed of graphene against the spatial frequencies in the X and Y directions.

FIG. 20 shows a schematic illustration of the area-normalized two-dimensional power spectral density (PSD) of a monolayer composed of graphene against the spatial frequencies in the X and Y directions. In this case, the area-normalized PSD corresponds to the square of the absolute value of the Fourier transform of the surface profile and deviates, on account of this area normalization, from the classic PSD, as used in text books:

$$PSD_{area-normalized} = \frac{1}{L_x L_y} * PSD_{classic} =$$

$$\lim_{L_x L_y \to \infty} \frac{1}{(L_x L_y)^2} \left| \int_{-L_x/2}^{L_x/2} \int_{-L_y/2}^{L_y/2} z_{(x,y)} e^{-i2\pi(f_x x + f_y y)} dx\, dy \right|^2$$

In this case, $L_x$ and $L_y$ denote the extent of the surface region considered in the X and Y directions, $f_x$ and $f_y$ denote the spatial frequencies and $z_{(x,y)}$ denotes the amplitude of the surface profile in the surface region considered.

The discrete spatial frequency spectrum of the honeycomb-like structure of graphene from FIG. 19 is clearly discernible in FIG. 20. A corresponding discrete spectrum can be determined experimentally for example using electron diffraction on graphene, see FIG. 17 in WO 2009/129194. In FIG. 20, the spatial frequencies shown white at approximately 3.3 l/nm are dominant, which corresponds to the spatial wavelength of 0.334 nm in accordance with the first interatomic distance in the graphene. As a result of the discrete structure of graphene, therefore, the discrete PSD of graphene in FIG. 20 differs from a continuous PSD of other surfaces, which is based on statistical surface defects.

Figure 21:
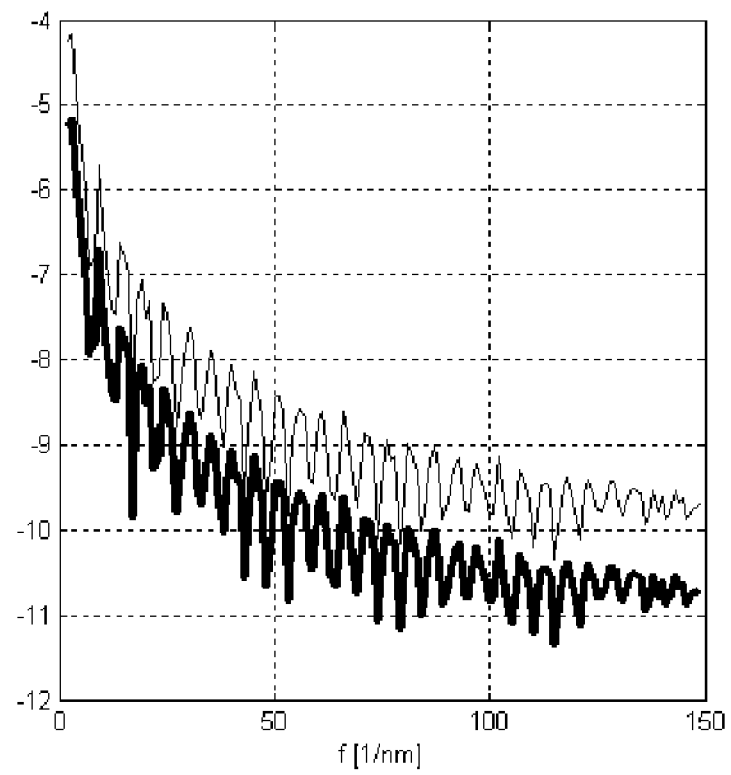
FIG. 21 shows a schematic illustration of the area-normalized radial PSD function of a monolayer composed of graphene against the spatial frequency in a radial direction.

FIG. 21 shows a schematic illustration of the area-normalized radial PSD function in logarithmic representation to base 10 for the amplitude of the PSD function of a monolayer composed of graphene against the spatial frequency in a radial direction as a thick line, and also ten times the area-normalized radial PSD function as a thin line for comparison. This area-normalized radial PSD is produced from the two-dimensional PSD shown in FIG. 20 by integration over the azimuth:

$$PSD_{area-normalized,radial} = \frac{1}{2\pi} \int_0^{2\pi} PSD_{area-normalized}(f, \varphi) d\varphi$$

The dominance of the spatial frequencies—identified as white in FIG. 20—at low spatial frequencies of less than 10 l/nm is clearly discernible in FIG. 21. It can likewise be discerned that graphene has harmonics up to spatial frequencies of 150 l/nm. None of the spatial frequencies illustrated in FIG. 21 can be resolved by an AFM microscope, since the latter can resolve only up to a frequency of approximately 0.1 l/nm and, consequently, can measure only the HSFR range.

Figure 22:
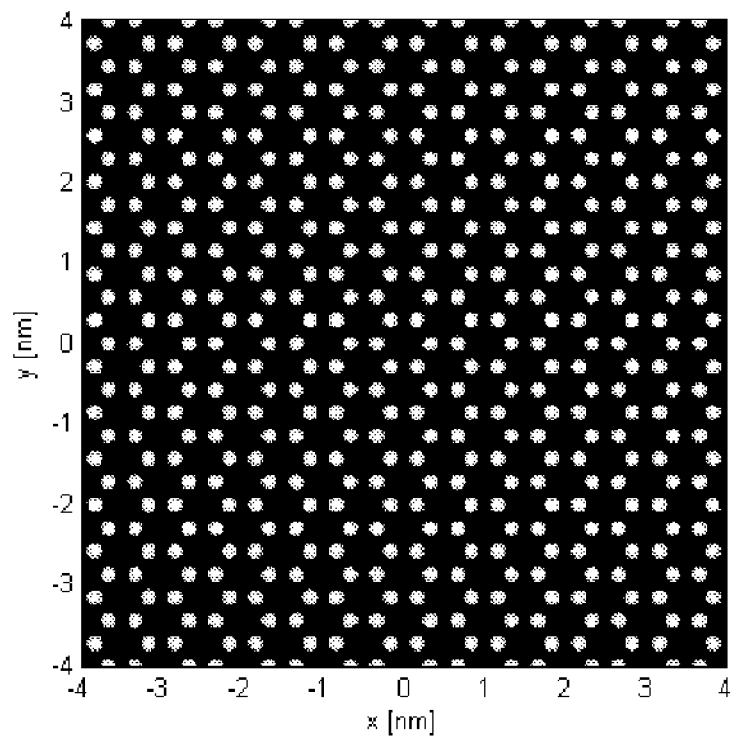
FIG. 22 shows a schematic illustration of the surface profile of a plurality of unit cells of a monolayer composed of graphene, this illustration being reduced in size by comparison with FIG. 19.

FIG. 22 shows a schematic illustration—reduced in size by comparison with FIG. 19—of the surface profile of a plurality of unit cells of a monolayer composed of graphene, which corresponds in terms of lateral extent approximately to the area over which the measuring tip of an AFM performs averaging. That means that an AFM determines, for the area illustrated in FIG. 22, only an average value of the surface profile, which does not deviate relative to an adjacent area within a region of a monolayer or multilayer composed of graphene of approximately 0.5 μm×0.5 μm. Consequently, a roughness determined using an AFM of 0 nm rms HSFR results for a graphene layer, since the AFM cannot laterally resolve the structure of the graphene and, consequently, cannot detect the frequency range above HSFR.

Figure 23:
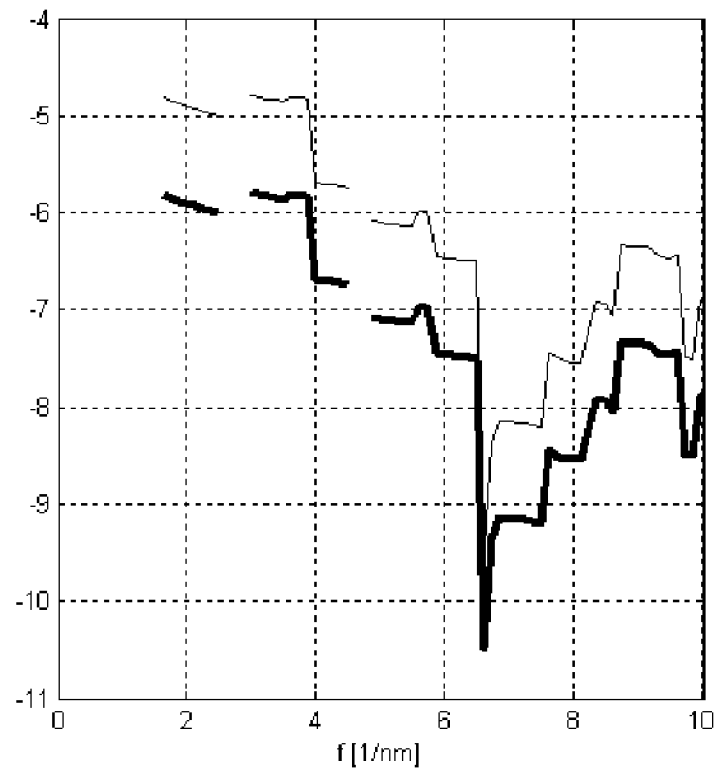
FIG. 23 shows a schematic illustration of the area-normalized radial PSD function of a monolayer composed of graphene against the spatial frequency in a radial direction, this illustration being enlarged by comparison with FIG. 21.

FIG. 23 shows a schematic illustration of the area-normalized radial PSD function of a monolayer composed of graphene against the spatial frequency in a radial direction, this illustration being enlarged relative to FIG. 21, wherein, for determining the area-normalized radial PSD function in FIG. 23, the frequency axis in FIG. 20, for numerical integration, was graduated more finely than for the determination of the area-normalized radial PSD function in FIG. 21. It is clearly discernible that, for spatial frequencies between 0 and approximately 1.6 l/nm, this concerns the range of figure, MSFR, HSFR to VHSFR, no amplitude of the PSD is present and, consequently, no roughness is present for the frequency range considered.

Above the spatial frequency of 1.6 l/nm as well there are frequency ranges in which no PSD and, consequently, no roughness are present. This is owing to the crystalline hexagonal structure of graphene, which has the effect that discrete frequencies or frequency bands appear in the Fourier spectrum of the surface profile and, consequently, in the case of graphene, a Fourier spectrum does not contain a uniform distribution as in the case of an amorphous or statistical surface structure.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:
1. A mirror comprising:
a substrate;
a reflecting layer arrangement;
at least one surface protecting layer; and
a graphene layer arranged between the reflecting layer arrangement and the at least one substrate protecting layer,
wherein the reflecting layer arrangement is configured such that light having a wavelength of less than 250 nm that is incident on the mirror at at least an angle of incidence of between 0° and 30° is reflected with more than 20% of its intensity, and the layer arrangement comprises at least one surface layer system (P''') comprising a periodic sequence of at least two periods ($P_3$) of individual layers, wherein the periods (P$_3$) comprise two individual layers composed of different materials providing a high refractive index layer (H''') and a low refractive index layer (L'''), wherein the graphene layer supports the reflecting layer arrangement on the at least one surface protecting layer and has a surface roughness of less than 0.1 nm rms HSFR (high spatial frequency roughness), and wherein the surface roughness of the graphene layer is less than a surface roughness of the surface protecting layer.

2. The mirror according to claim 1, wherein the reflecting layer arrangement comprises at least one layer which is formed from or as a compound is composed of a material from the group consisting of: nickel, carbon, graphene, boron carbide, cobalt, beryllium, silicon, and silicon oxides.

3. The mirror for the EUV wavelength range according to claim 2, wherein the at least one surface protecting layer comprises at least one surface protecting layer system (SPLS) comprising a periodic sequence of at least two periods (P$_p$) of individual layers, where the periods (P$_p$) comprise two individual layers composed of different materials for a high refractive index layer (H$_p$) and a low refractive index layer (L$_p$), wherein the materials of the two individual layers (L$_p$, H$_p$) forming the periods (P$_p$) are either nickel and silicon or cobalt and beryllium.

4. The mirror for the EUV wavelength range according to claim 3, wherein the individual layers are separated by at least one barrier layer (B) and the barrier layer comprises a material which is selected from or as a compound is composed of at least one material selected from the group consisting of: B$_4$C, C, graphene, Si nitride, Si carbide, Si boride, Mo nitride, Mo carbide, Mo boride, Ru nitride, Ru carbide and Ru boride.

5. The mirror for the EUV wavelength range according to claim 2, wherein the materials of the two individual layers (L'', H'', L''', H''') forming the periods (P$_2$, P$_3$) are either molybdenum and silicon or ruthenium and silicon, and wherein a covering layer system (C) comprises at least one layer (M) composed of a chemically inert material and terminates the reflecting layer arrangement of the mirror.

6. The mirror for the EUV wavelength range according to claim 2, wherein the at least one surface protecting layer comprises at least one surface protecting layer system (SPLS) comprising a periodic sequence of at least two periods (P$_p$) of individual layers, wherein the periods (P$_p$) comprise two individual layers composed of different materials providing a low refractive index layer (L$_p$) and a barrier layer (B).

7. A projection objective for microlithography comprising a mirror according to claim 1.

8. A projection exposure apparatus for microlithography comprising a projection objective according to claim 7.

9. The mirror according to claim 1, wherein the at least one substrate protecting layer has a surface roughness of between 10 nm and 1.0 μm.

10. A mirror comprising a substrate and a reflecting layer arrangement, wherein the reflecting layer arrangement is configured such that light having a wavelength of less than 250 nm that is incident on the mirror at at least an angle of incidence of between 0° and 30° is reflected with more than 20% of its intensity, and the reflecting layer arrangement comprises at least one surface layer system (P''') comprising a periodic sequence of at least two periods (P$_3$) of individual layers, wherein the periods (P$_3$) comprise two individual layers composed of different materials providing a high refractive index layer (H'''), a low refractive index layer (L''') and a graphene layer arranged between the high refractive index layer and the low refractive index layer, wherein the graphene layer has a surface roughness of less than 0.1 nm rms HSFR (high spatial frequency roughness) and is configured to suppress interdiffusion between the high refractive index layer and the low refractive index layer and to increase an optical contrast between the high refractive index layer and the low refractive index layer.

11. The mirror according to claim 10, wherein the graphene layer has a surface roughness of less than 0.1 nm rms for spatial frequencies above the HSFR range.

12. The mirror according to claim 10, wherein the mirror is a mirror for the extreme-ultraviolet (EUV) wavelength range which reflects EUV radiation incident on the mirror at at least an angle of incidence with respect to the normal at the point of impingement on the mirror surface of between 0° and 30° with more than 20% of its intensity.

13. The mirror for the EUV wavelength range according to claim 12, wherein the reflecting layer arrangement comprises at least one surface protecting layer system (SPLS) comprising a periodic sequence of at least two periods (P$_p$) of individual layers, where the periods (P$_p$) comprise two individual layers composed of different materials for a high refractive index layer (H$_p$) and a low refractive index layer (L$_p$), wherein the materials of the two individual layers (L$_p$, H$_p$) forming the periods (P$_p$) are either nickel and silicon or cobalt and beryllium.

14. The mirror for the EUV wavelength range according to claim 12, wherein the materials of the two individual layers (L'', H'', L''', H''') forming the periods (P$_2$, P$_3$) are either molybdenum and silicon or ruthenium and silicon, and wherein a covering layer system (C) comprises at least one layer (M) composed of a chemically inert material and terminates the layer arrangement of the mirror.

15. The mirror for the EUV wavelength range according to claim 12, wherein the reflecting layer arrangement comprises at least one surface protecting layer system (SPLS) comprising a periodic sequence of at least two periods (P$_p$) of individual layers, wherein the periods (P$_p$) comprise two individual layers composed of different materials providing a low refractive index layer (L$_p$) and a barrier layer (B).

16. The mirror for the EUV wavelength range according to claim 15, wherein the material for the low refractive index layer (L$_p$) consists of nickel.

17. The mirror for the EUV wavelength range according to claim 15, wherein the at least one surface protecting layer system (SPLS) has layers having a surface roughness of less than 0.5 nm rms HSFR.

18. The mirror for the EUV wavelength range according to claim 17, wherein the substrate consists of a metal or a metal alloy.

19. A projection objective for microlithography comprising a mirror according to claim 10.

20. A projection exposure apparatus for microlithography comprising a projection objective according to claim 19.

21. The mirror according to claim 10, further comprising at least one substrate protecting layer having a surface roughness of between 10 nm and 1.0 μm.

22. The mirror according to claim 10, further comprising a second graphene layer between the at least two periods (P$_3$) of individual layers.

* * * * *

UNITED STATES PATENT AND TRADEMARK OFFICE
CERTIFICATE OF CORRECTION

PATENT NO. : 9,575,224 B2  
APPLICATION NO. : 13/846785  
DATED : February 21, 2017  
INVENTOR(S) : Rolf Freimann et al.

Page 1 of 1

It is certified that error appears in the above-identified patent and that said Letters Patent is hereby corrected as shown below:

On the Title Page

In item (57), in Column 2, in "Abstract", Line 1, delete "1b;" and insert --1b'; --, therefor. (Second Occurrence)

In the Specification

In Column 20, Line 62, delete "$Z(h) = (rho * h^2)/(1 + [1 - (1 + k_y) * (rho * h)^2]^{0.5}) + +c_1 * h^4 + c_2 * h^6 + c_3 * h^8 + c_4 * h^{10} + c_5 * h^{12} + c_6 * h^{14}$" and insert -- $Z(h) = (rho * h^2)/(1 + [1 - (1 + k_y) * (rho * h)^2]^{0.5}) + c_1 * h^4 + c_2 * h^6 + c_3 * h^8 + c_4 * h^{10} + c_5 * h^{12} + c_6 * h^{14}$ --, therefor.

In Column 21, Line 62, after "$R_{min}$" insert -- in --.

In the Claims

In Column 38, Line 54, in Claim 18, delete "claim 17," and insert -- claim 12, --, therefor.

Signed and Sealed this  
First Day of December, 2020

Andrei Iancu  
*Director of the United States Patent and Trademark Office*